United States Patent
Saijo et al.

(10) Patent No.: US 9,045,836 B2
(45) Date of Patent: Jun. 2, 2015

(54) ELECTROLYTIC REGENERATION DEVICE

(75) Inventors: Yoshikazu Saijo, Hirakata (JP);
Hisamitsu Yamamoto, Hirakata (JP);
Takahiro Ishizaki, Hirakata (JP)

(73) Assignee: C. Uyemura & Co., Ltd., Osaka (JP)

( * ) Notice: Subject to any disclaimer, the term of this patent is extended or adjusted under 35 U.S.C. 154(b) by 65 days.

(21) Appl. No.: 13/218,855

(22) Filed: Aug. 26, 2011

(65) Prior Publication Data
US 2012/0048728 A1 Mar. 1, 2012

(30) Foreign Application Priority Data

Aug. 27, 2010 (JP) ................................ 2010-191127
Jun. 14, 2011 (JP) ................................ 2011-132095

(51) Int. Cl.
*C25B 1/28* (2006.01)
*C25B 15/08* (2006.01)
*H05K 3/00* (2006.01)

(52) U.S. Cl.
CPC . *C25B 1/28* (2013.01); *C25B 15/08* (2013.01); *H05K 3/0055* (2013.01)

(58) Field of Classification Search
CPC .................................. C25B 1/28; C25B 15/08
USPC ................... 204/272; 205/475, 476
See application file for complete search history.

(56) References Cited

U.S. PATENT DOCUMENTS

| | | | | |
|---|---|---|---|---|
| 3,062,734 A | * | 11/1962 | Carus | 204/270 |
| 4,014,766 A | * | 3/1977 | Watanabe et al. | 205/746 |
| 5,062,930 A | * | 11/1991 | Dillon et al. | 205/475 |
| 7,374,645 B2 | * | 5/2008 | Davis et al. | 204/242 |
| 2002/0008014 A1 | * | 1/2002 | Adachi et al. | 204/164 |
| 2003/0141198 A1 | * | 7/2003 | De Boer et al. | 205/475 |
| 2005/0183964 A1 | * | 8/2005 | Roberts et al. | 205/701 |
| 2006/0249374 A1 | * | 11/2006 | Wunsche et al. | 204/242 |
| 2009/0090627 A1 | * | 4/2009 | Andelman et al. | 204/450 |
| 2013/0092615 A1 | * | 4/2013 | Cao et al. | 210/243 |

FOREIGN PATENT DOCUMENTS

| | | |
|---|---|---|
| JP | 04-074879 A | 3/1992 |
| JP | 06-306668 A | 11/1994 |

(Continued)

OTHER PUBLICATIONS

Japanese Notice of Reasons for Rejection issued in corresponding Japanese Application No. 2011-132095 mailed on Oct. 30, 2012.

(Continued)

*Primary Examiner* — Harry D Wilkins, III
*Assistant Examiner* — Ciel Thomas
(74) *Attorney, Agent, or Firm* — Sughrue Mion, PLLC

(57) ABSTRACT

The regeneration unit includes a tubular portion having the inner circumferential surface functioning as an anode, and a cathode provided inside the tubular portion and extending along the extension direction of the tubular portion in a state of separation from the inner circumferential surface. The treatment liquid used for desmearing treatment is fed through a gap between the inner circumferential surface of the tubular portion and the cathode. A feed-side conduit is connected by a downstream end portion thereof to the tubular portion and guides the treatment liquid discharged from a desmearing treatment tank into a regeneration unit. A return-side conduit is connected by an upstream end portion thereof to the tubular portion and guides the treatment liquid discharged from the regeneration unit into the desmearing treatment tank.

9 Claims, 13 Drawing Sheets

(56) References Cited

FOREIGN PATENT DOCUMENTS

| | | |
|---|---|---|
| JP | 09-235690 A | 9/1997 |
| JP | 10-280181 A | 10/1998 |
| JP | 3301341 A | 4/2002 |
| JP | 2003-298210 A | 10/2003 |
| JP | 2005-330514 A | 12/2005 |
| WO | WO 2009129670 A1 * | 10/2009 .............. C02F 1/461 |

OTHER PUBLICATIONS

Japanese Office Action issued in Japanese Application No. 2012-279779, dated Nov. 26, 2013.

* cited by examiner

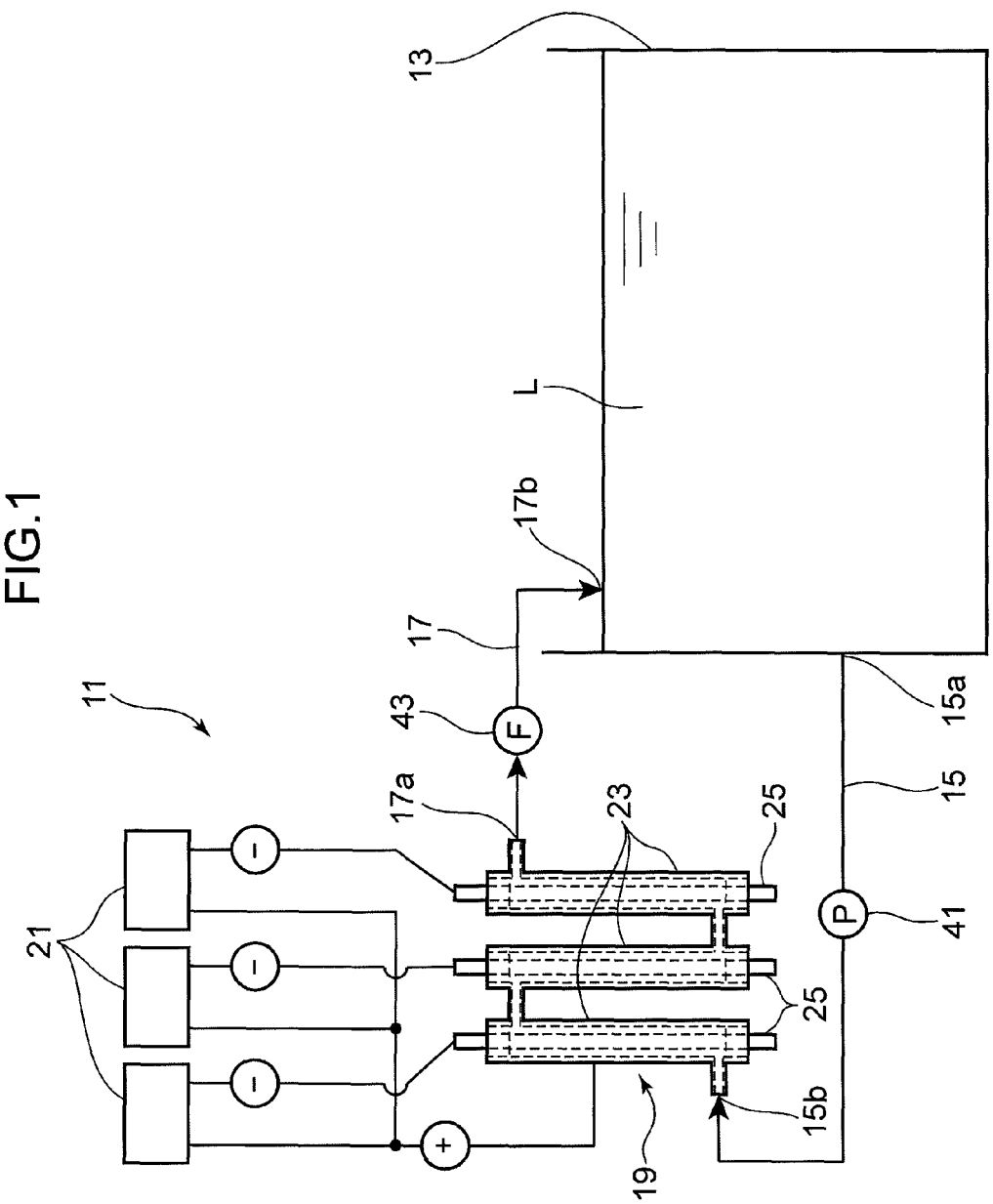

ELECTROLYTIC REGENERATION DEVICE

BACKGROUND OF THE INVENTION

1. Field of the Invention

The present invention relates to an electrolytic regeneration device for electrolytic regeneration of treatment liquid used in desmearing treatment in a manufacturing process for production of printed circuit boards or the like.

2. Description of the Background Art

When through holes or via holes are formed in a resin substrate used for a printed circuit board, smear, which is a resin debris, is generated by friction heat of a drill or laser and the resin. In order to maintain electric connection reliability of printed circuit boards, it is necessary to remove by a chemical treatment method or the like (desmearing treatment) the smear generated in through or via holes.

A solution of a permanganate such as sodium permanganate and potassium permanganate is typically used as a treatment liquid in the chemical treatment method. The treatment liquid is stored in a desmearing treatment tank. Where the resin substrate is immersed in the treatment liquid in the desmearing treatment tank to perform the desmearing treatment, the smear is oxidized and removed from through or via holes, and the permanganate in the treatment liquid is converted into a manganate. In order to reuse the treated treatment liquid for smear removal, electrolytic regeneration is performed that converts the manganate contained in the treatment liquid into the permanganate.

The conventional electrolytic regeneration device includes an electrolytic regeneration tank that stores the treatment liquid, electrodes immersed into the treatment liquid in the electrolytic regeneration tank, a feed-side conduit for feeding the treatment liquid discharged from the desmearing treatment tank into the electrolytic regeneration tank, and a return-side conduit for feeding the treatment liquid subjected to the electrolytic regeneration into the desmearing treatment tank. The treatment liquid circulates between the desmearing treatment tank and the electrolytic regeneration tank. In such an electrolytic regeneration device, a plurality of electrodes is usually disposed to increase the regeneration efficiency (see, for example, Japanese Patent No. 3,301,341).

However, with the configuration in which a plurality of electrodes is thus provided in the electrolytic regeneration tank, the volume of the electrolytic regeneration tank should be increased (to a value that is by a factor of about 1 to 2 larger than that of the desmearing treatment tank). As a result, a large installation area for arranging the electrolytic regeneration tank should be ensured and the bath volume increases.

SUMMARY OF THE INVENTION

The present invention has been created with the foregoing in view and it is an object of the present invention to provide an electrolytic regeneration device reduced in size and decreased in bath volume.

The electrolytic regeneration device in accordance with the present invention serves for electrolyzing and regenerating a treatment liquid used in a desmearing treatment in a desmearing treatment tank. The electrolytic regeneration device includes a regeneration unit, a feed-side conduit, and a return-side conduit. The regeneration unit includes a tubular portion having an inner circumferential surface functioning as an anode and a cathode provided inside the tubular portion and extending along an extension direction of the tubular portion in a state of separation from the inner circumferential surface. In the regeneration unit, the treatment liquid is fed through a gap between the inner circumferential surface of the tubular portion and the cathode. The feed-side conduit is connected by a downstream end portion thereof to the tubular portion and guides the treatment liquid discharged from the desmearing treatment tank into the regeneration unit. The return-side conduit is connected by an upstream end portion thereof to the tubular portion and guides the treatment liquid discharged from the regeneration unit into the desmearing treatment tank.

BRIEF DESCRIPTION OF THE DRAWINGS

FIG. 1 is a schematic drawing illustrating the electrolytic regeneration device of the first embodiment of the present invention and the desmearing treatment tank to which the electrolytic regeneration device is connected;

DESCRIPTION OF THE PREFERRED EMBODIMENTS

Figure 2A:
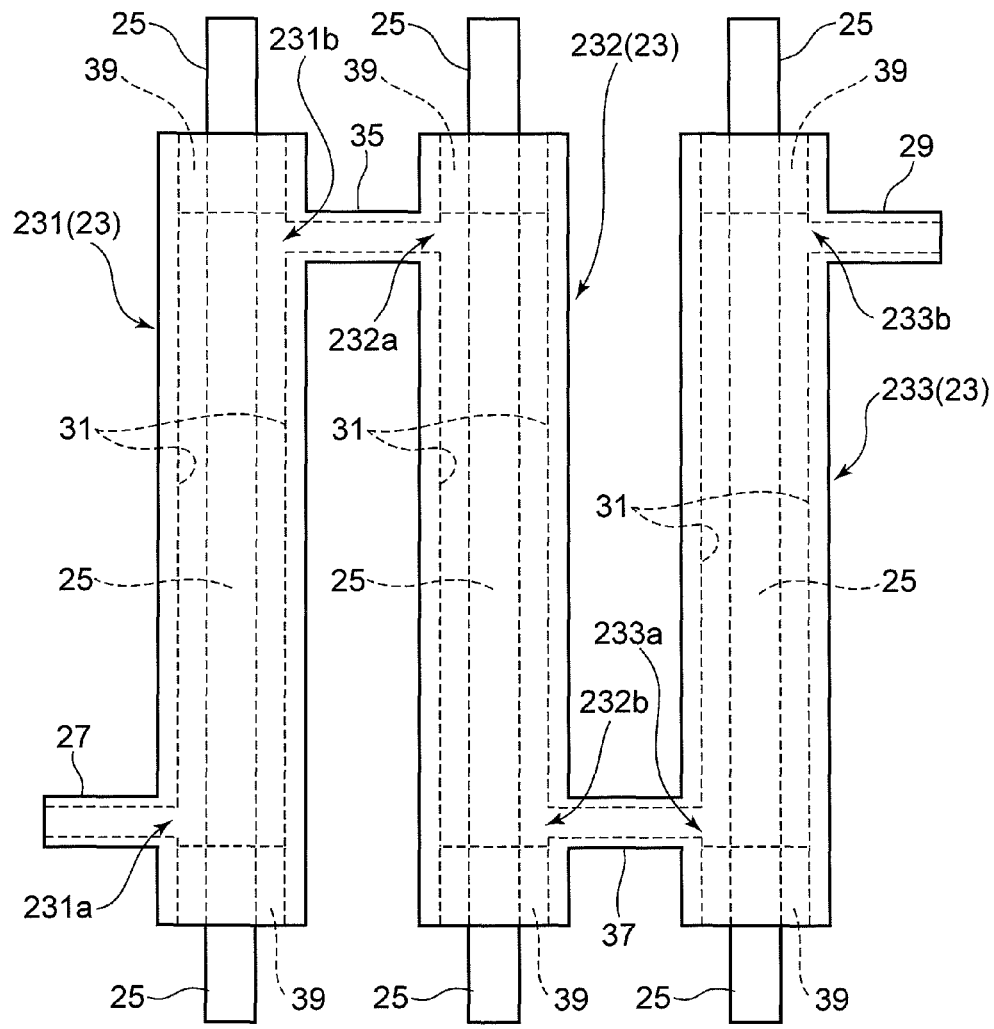
FIG. 2A is an enlarged schematic drawing of the regeneration unit in the electrolytic regeneration device.

Electrolytic regeneration devices according to the embodiments of the present invention will be described below in greater detail with reference to the appended drawings.

First Embodiment

As shown in FIG. 1, an electrolytic regeneration device 11 according to the first embodiment of the present invention serves for electrolyzing and regenerating a treatment liquid for reusing in smear removal the treatment liquid that has been used for desmearing treatment in the printed circuit board manufacturing process. The case in which a solution of a permanganate such as sodium permanganate and potassium permanganate is used as the treatment liquid L is described below by way of example. The treatment liquid L is stored in a desmearing treatment tank 13.

A resin substrate (not shown in the figure) constituting the substrate portion of the printed circuit board is subjected to desmearing treatment by immersion in the treatment liquid in the desmearing treatment tank 13. As a result, the smear present in through holes or via holes of the resin substrate is oxidized by the treatment liquid L and removed from the through holes and via holes. Part of the permanganate is reduced and converted into a manganate in the treatment liquid L used for the desmearing treatment. Therefore, in order to reuse the treatment liquid for smear removal, the treatment liquid L is subjected to electrolytic regeneration treatment by which the manganate is oxidized into the permanganate in the electrolytic regeneration device 11.

As shown in FIG. 1, the electrolytic regeneration device 11 is provided with a feed-side conduit 15, a return-side conduit 17, a regeneration unit 19, a pump 41, and a filter 43.

An upstream end portion 15a of the feed-side conduit 15 is connected to a side surface of the desmearing treatment tank 13. A downstream end portion 15b of the feed-side conduit 15 is connected to an upstream end portion of the regeneration unit 19.

An upstream end portion 17a of the return-side conduit 17 is connected to a downstream end portion of the regeneration unit 19. A downstream end portion 17b of the return-side conduit 17 is disposed at a position in which the treatment liquid L can be introduced into the desmearing treatment tank 13. In the present embodiment, the downstream end portion 17b of the return-side conduit 17 is disposed above the level of the treatment liquid L or in the treatment liquid L stored in the desmearing treatment tank 13.

As shown in FIG. 2, the regeneration unit 19 includes three pipes 23 as tubular sections and a total of three cathodes 25 installed by one cathode inside each pipe 23. The three pipes 23 are constituted by a first pipe 231, a second pipe 232, and a third pipe 233.

Each pipe 23 has a cylindrical shape extending in the axial direction. Each pipe 23 has openings at both ends in the longitudinal direction (extension direction). These pipes 23 are disposed parallel to each other so that the longitudinal axis of each pipe is in the vertical direction. These pipes 23 are disposed side by side in the horizontal direction.

An inner circumferential surface 31 of each pipe 23 functions as an anode. Each pipe 23 is formed from a conductive material. For example, a metal material such as stainless steel can be used to configure the pipes 23. The stainless steel is for example SUS316.

Figure 2B:
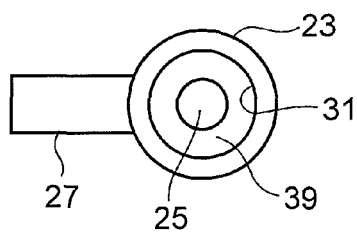
FIG. 2B is a schematic view of pipes and cathode in the regeneration unit, as viewed from the bottom surface side.

As shown in FIGS. 2A and 2B, a cathode 25 is provided inside each pipe 23. The cathode 25 extends in the longitudinal direction of the pipe 23 in a state of separation from the inner circumferential surface 31 of the pipe 23. Both ends of each cathode 25 protrude from the openings at both ends of the pipes 23. The cathode 25 is formed from a conductive material. For example, a metal material such a copper can be used to configure the cathodes 25. A portion of the surface of the cathode 25 can be covered by an insulator (non-conductor), for example, polytetrafluoroethylene, and the surface area of the cathode 25 can be adjusted. In the present embodiment, the cathode 25 has a round columnar shape, but such a shape is not limiting and the cathode may have a different shape, for example, an angular columnar shape.

A sealing member 39 is disposed between the inner circumferential surface 31 of the pipe and the cathode 25 in the vicinity of the openings at both ends of each pipe 23. The sealing member 39 has a cylindrical shape with a through hole, and the cathode 25 is inserted into the through hole. The sealing members 39 close in a liquid-tight state the openings at both ends of the pipe 23.

The sealing members 39 installed at both ends of the pipes 23 support the cathodes 25 in a state of separation from the inner circumferential surface (anode) 31. The sealing members 39 play the role of preventing the treatment liquid flowing inside the regeneration unit 19 from leaking from the openings at both ends of each pipe 23 and also play the role of insulating the cathodes 25 from the anodes (inner circumferential surface 31). For example, a synthetic rubber or synthetic resin can be used as the material constituting the sealing members 39. For example, polytetrafluoroethylene can be used as the synthetic resin.

The cross sections of the pipes 23 and the cathodes 25 perpendicular to the longitudinal direction have substantially constant shapes along the substantially entire length in the longitudinal direction. Therefore, the cross section of the flow channel that is a gap between the inner circumferential surface 31 of each pipe 23 and the cathode 25 corresponding thereto also has a substantially constant shape along the substantially entire length in the longitudinal direction.

Of the three pipes 23, the first pipe 231 is at the upstreammost position, and the third pipe 233 is at the downstreammost position. The first pipe 231 has a connection portion 27 for connection to the downstream end portion 15b of the feed-side conduit 15. This connection portion 27 is provided at one end portion (upstream end portion) 231a of the first pipe 231. This connection portion 27 has a cylindrical shape protruding radially (width direction) outward from the inner surface of the first pipe 231. The connection portion 27 is provided on the inner side, in the longitudinal direction, of the sealing member 39.

The other end portion (downstream end portion) 231b of the first pipe 231 communicates via a connection pipe 35 with one end portion (upstream end portion) 232a of the second pipe 232. The other end portion (downstream end portion) 232b of the second pipe 232 communicates via a connection pipe 37 with one end portion (upstream end portion) 233a of the third pipe 233.

The third pipe 233 has a connection portion 29 connected to the upstream end portion 17a of the return-side conduit 17. This connection portion 29 is provided at the other end portion (downstream end portion) 233b of the third pipe 233. The connection portion 29 has a cylindrical shape protruding radially (width direction) outward from the inner surface of the third pipe 233. The connection portion 29 is provided on the inside, in the longitudinal direction, from the sealing member 39.

The gap between the inner circumferential surface 31 of each pipe 23 and the cathode 25 serves as a flow channel for the treatment liquid L. The flow channel for the treatment liquid L is formed in each pipe 23 on the inner side, in the longitudinal direction, of the sealing members 39. The inner space of each pipe 23 and the inner space of the connection pipes 35, 37 are connected to the outside only via the connection portion 27 and the connection portion 29. The first pipe 231, second pipe 232, and third pipe 233 form one continuous flow channel from the connection portion 27 to the connection portion 29. The entire amount of the treatment liquid L flowing into the first pipe 231 through the connection portion 27 flows in the regeneration unit 19 through the first pipe 231, connection pipe 35, second pipe 232, connection pipe 37, and third pipe 233 in the order of description, and then flows out to the return-side conduit 17 through the connection portion 29.

The one end portion and the other end portion of each pipe 23 are not necessarily limited to the regions positioned at the very end of each pipe 23 in the longitudinal direction. Thus, as shown in FIG. 2A, one end portion of each pipe 23 is the region of the flow channel for the treatment liquid L inside the pipe 23 that corresponds to a position substantially at the end on the upstream side, and the other end portion of the pipe 23 is the region of the flow channel for the treatment liquid L inside the pipe 23 that corresponds to a position substantially at the end on the downstream side.

As shown in FIG. 1, a voltage is applied by a rectifier 21 between the anode and the cathode 25 of the regeneration unit 19. The rectifier 21 is connected to an external power supply (not shown in the figure). A negative pole of the rectifier 21 is connected to the upper end of each cathode 25, and the positive pole of the rectifier 21 is connected to the outer circumferential surface of the first pipe 231. Each pipe 23 and the connection pipes 35, 37 are entirely constituted by conductive materials. Therefore, where the positive pole of the rectifier 21 is connected to the outer circumferential surface of the first pipe 231, the inner circumferential surface 31 of each pipe 23 can be caused to function as an anode.

The length of each cathode 25 and the length of each pipe 23 are not particularly limited, but because bending deformation easier occurs with the increase in length, it is preferred that a plurality of pipes 23 be connected and the cathodes 25 be installed inside the pipes 23 as in the present embodiment. As a result, the lengths of the cathodes 25 and pipes 23 can be reduced, while increasing the total length.

As the distance between the cathode 25 and the anode 31 (inter-electrode distance) decreases, short circuit is more likely to occur due to deposition of the manganate generated on the surface of the cathode 25, but as the distance increases, the flow of electric current is inhibited and the amount of voltage used tends to increase. Therefore, the inter-electrode distance is adjusted with consideration for these facts. In the present embodiment, the feed-side conduit 15 is directly connected to the first pipe 231, and the treatment liquid is directly introduced into the gap between the inner circumferential surface 31 of each pipe 23 and the cathode 25. Therefore, the flow velocity of the treatment liquid flowing in the flow channel inside the pipes 23 can be increased over that in the case in which the electrolytic regeneration tank is used, as in the conventional configuration. Therefore, in the present embodiment, the effect of removing the manganate generated on the surface of the cathode 25 from the surface of the cathode 25 by the flow of the treatment liquid having a high flow velocity is superior to that in the conventional example. As a result, in the present embodiment, the inter-electrode distance can be reduced by comparison with that in the conventional example.

From the standpoint of decreasing the amount of liquid (bath volume) in the regeneration unit 19, it is preferred that the inner diameter of the pipes 23 be as small as possible, and the specific inner diameter is designed as appropriate with consideration for the above-mentioned inter-electrode distance between the anode and the cathode 25.

The flow velocity of the treatment liquid L flowing in the flow channel inside the pipes 23 is preferably adjusted for example to about 5 mm/sec to 100 mm/sec. By setting the flow velocity equal to or greater than 5 mm/sec, it is possible to obtain an excellent effect of removing (pushing out) the sludge generated on the surface of the cathode 25 from the surface of the cathode 25. By setting the flow velocity to a value equal to or less than 100 mm/sec, it is possible to prevent the contact time of the cathode 25 and the treatment liquid L from becoming too short. As a result, the regeneration efficiency of the treatment liquid L is prevented from becoming too low.

After the flow velocity of the treatment liquid L flowing inside the flow channel for the pipes 23 has decreased during the regeneration treatment (during current conduction from the rectifier 21) and the regeneration treatment has ended (current conduction has stopped), the flow velocity may be increased with the object of removing the sludge from the surface of the cathode 25. This control may be repeated for each predetermined period. Further, this control may be executed automatically by control means (not shown in the figure), or may be executed manually by the operator.

The flow velocity may be made different in each pipe 23. A method, for example, such that involves using pipes 23 of different diameter, can be used to obtain different flow velocities in the pipes 23.

Further, thermal insulating properties of the outer circumferential surface of the pipes 23 may be increased or the outer circumferential surface may be coated with another member in order to suppress bending deformation.

In the present embodiment, since the configuration such as described hereinabove is provided, the bath volume of the electrolytic regeneration device 11 can be made less than that of the desmearing treatment tank 13. More specifically, the ratio of the bath volume of the electrolytic regeneration device 11 and the bath volume of the desmearing treatment tank 13 is preferably about 1:2 to 1:20, more preferably about 1:3 to 1:10. The bath volume of the electrolytic regeneration device 11 includes not only the bath volume of the regeneration unit 19, but also the bath volume of the feed-side conduit 15 and the bath volume of the return-side conduit 17. In the conventional device using the electrolytic regeneration tank, the ratio of the bath volume of the electrolytic regeneration device (the bath volume of the electrolytic regeneration tank, the bath volume of the feed-side conduit 15, and the bath volume of the return-side conduit 17) to the bath volume of the desmearing treatment tank is about 2:1 to 1:1.

The anode current density is preferably about 1 A/dm$^2$ to 30 A/dm$^2$. By setting the anode current density to a value equal to or greater than 1 A/dm$^2$, it is possible to bring the electric potential between the anode and the cathode 25 sufficiently close to the regeneration potential at which a manganate ion is electrolyzed into a permanganate ion ($MnO_4^{2-} \rightarrow MnO_4^- + e$). As a result, the regeneration efficiency can be prevented from decreasing. By setting the anode current density to a value equal to or less than 30 A/dm$^2$, it is possible to suppress the generation of hydrogen. Therefore, the decrease in regeneration efficiency can be prevented. It is also preferred that the cathode current density be about 0.3 A/dm$^2$ to 30,000 A/dm$^2$.

The surface area ratio of the anode 31 and the cathode 25 is preferably about 3:1 to 1000:1. This ratio can be adjusted, for example, by covering part of the surface of the cathode 25 with an insulator, as described hereinabove. Where the surface area of the cathode 25 increases, the amount of sludge generated on the surface of the cathode 25 also increases. Therefore, it is preferred that the surface area of the cathode 25 be less than that of the anode 31.

When a solution of a permanganate such as sodium permanganate and potassium permanganate is used as the treatment liquid L, the electrolytic regeneration temperature in the regeneration unit 19 (temperature of the treatment liquid L) is preferably about 30° C. to 90° C. The temperature of the treatment liquid L can be adjusted, for example, by heating the pipes 23 or by heating the feed-side conduit 15 or the return-side conduit 17. A method in which the pipes 23, feed-side conduit 15, and return-side conduit 17 are covered by a jacket having a heating source such as steam or thermoelectric wire can be used for heating.

The pump 41 is provided in the feed-side conduit 15. Where the pump 41 is driven, the treatment liquid L is discharged from the desmearing treatment tank 13 and pumped into the first pipe 231 of the regeneration unit 19 through the feed-side conduit 15. The treatment liquid L flows into the first pipe 231 via the connection portion 27 of the first pipe 231. The treatment liquid L is electrolyzed in the process of flowing in the flow channel of the pipes 23 in a state in which a voltage is applied by the rectifier 21 between the cathode 25 and the anode 31. The treatment liquid L that has been electrolyzed and regenerated in the regeneration unit 19 is discharged from the third pipe 233 and pumped into the desmearing treatment tank 13 via the return-side conduit 17.

The filter 43 is provided in the return-side conduit 17. In the regeneration unit 19, sludge (manganese dioxide) is generated on the surface of the cathode 25 by the electrolytic regeneration. This sludge is removed from the surface of the cathode 25 by the flow of the treatment liquid L and pumped together with the treatment liquid L into the return-side conduit 17. The sludge contained in the treatment liquid L is trapped by the filter 43. The filter 43 is periodically replaced or the sludge that has adhered to the filter 43 is periodically removed.

A plurality of filters 43 may be provided in the return-side conduit 17. Further, instead of providing the filter 43 in the return-side conduit 17, it is also possible to provide a small tank for sludge removal (not shown in the figure) in the return-side conduit 17.

Figure 3:
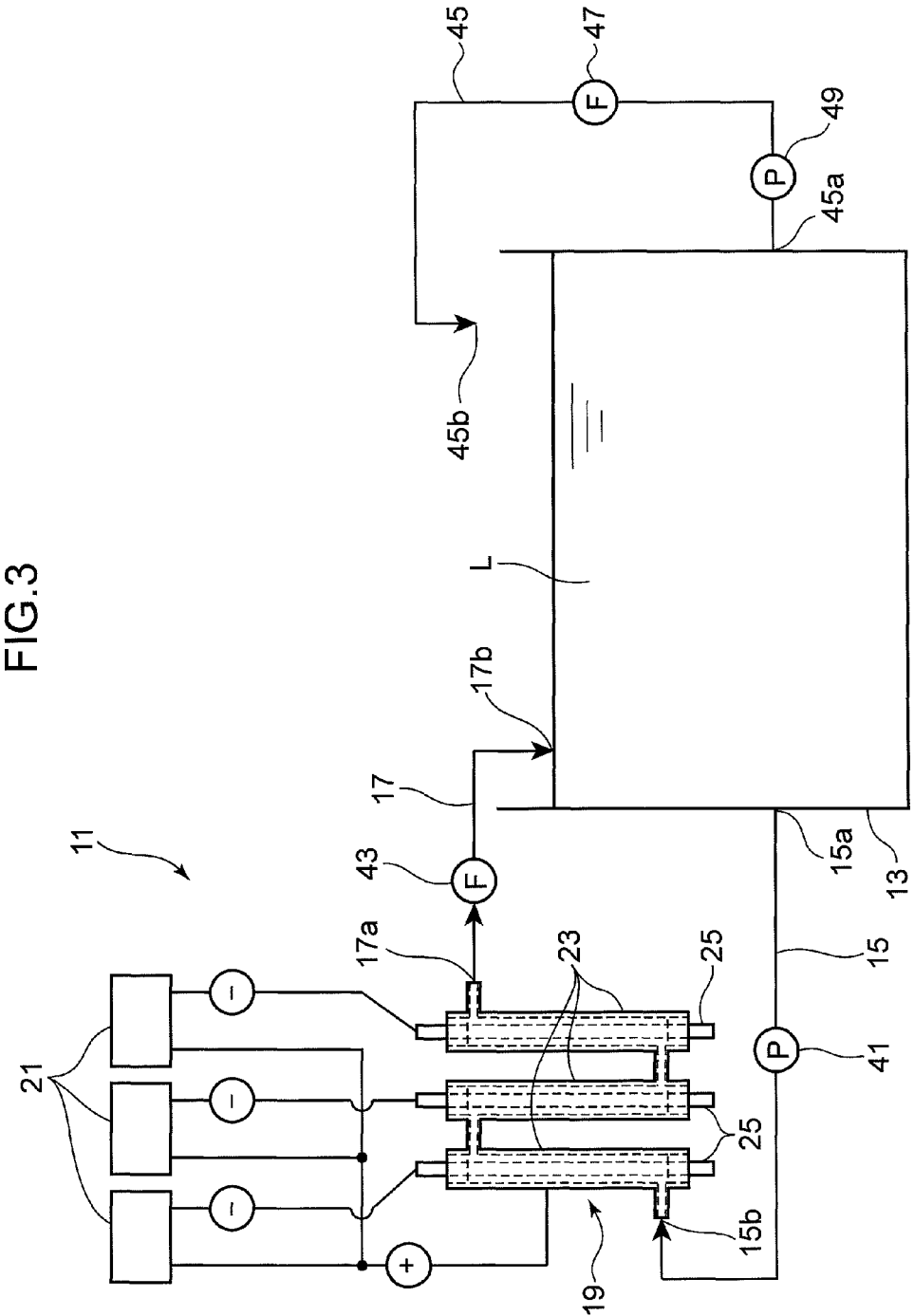
FIG. 3 is a schematic drawing illustrating the configuration in which a pipe provided with a filter and a pump is connected to the desmearing treatment tank shown in FIG. 1.

FIG. 3 is a schematic drawing illustrating the state in which a pipe 45 for sludge removal is further provided in the desmearing treatment tank 13 shown in FIG. 1. A filter 47 and a pump 49 are provided in the pipe 45. A proximal end portion 45a of the pipe 45 is connected to a side surface of the desmearing treatment tank 13. A distal end 45b of the pipe 45 is disposed above the desmearing treatment tank 13. By providing such pipe 45, pump 49, and filter 47, it is possible to increase further the sludge removal efficiency.

Figure 4:
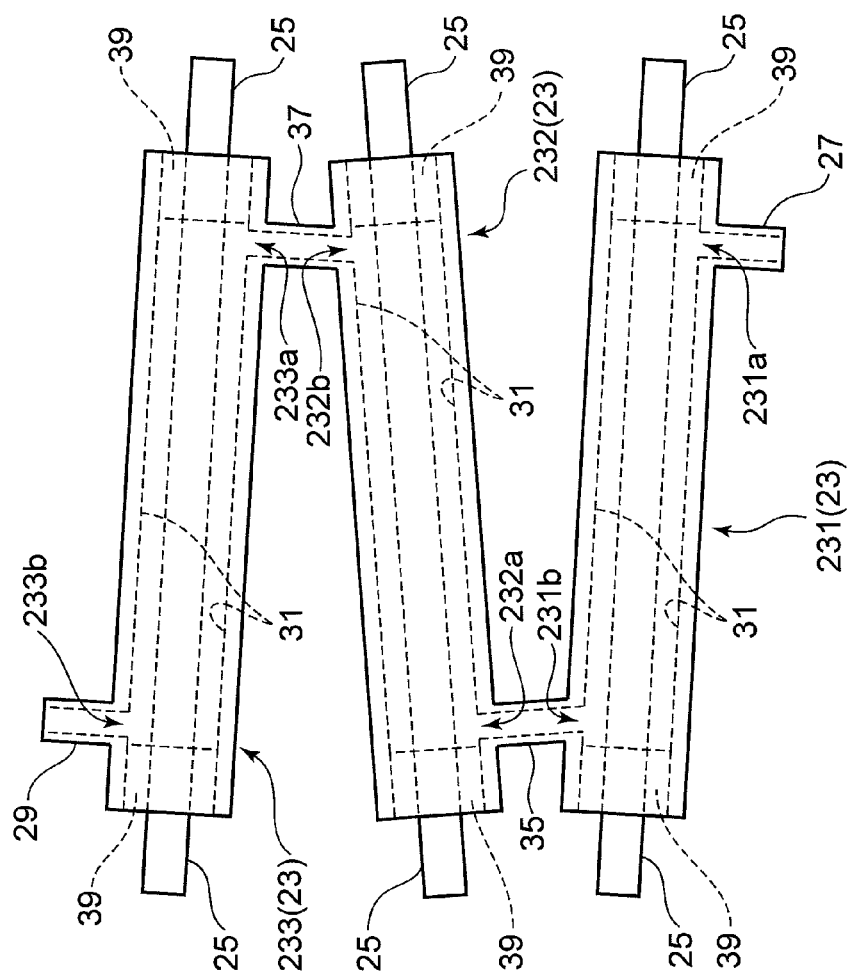
FIG. 4 is a schematic drawing illustrating a variation example of the regeneration unit in the electrolytic regeneration device.

FIG. 4 is a schematic drawing illustrating a variation example of the regeneration unit 19 in the electrolytic regeneration device 11. The regeneration unit 19 of this variation example is similar to the regeneration unit 19 shown in FIG. 2 in that the first pipe 231, second pipe 232, and third pipe 233 form a single flow channel extending from the connection portion 27 on the upstream side to the connection portion 29 on the downstream side, but is different from the regeneration unit 19 shown in FIG. 2 in that the pipe 23 on the downstream side of the regeneration unit 19 of the variation example is disposed above the pipe 23 on the upstream side. Thus, the second pipe 232 is disposed above the first pipe 231, and the third pipe 233 is disposed above the second pipe 232. Further, the longitudinal direction of each pipe 23 is disposed slightly obliquely with respect to the horizontal direction.

More specifically, in the first pipe 231 shown in FIG. 4, the downstream portion where the connection pipe 35 is connected is positioned higher than the upstream portion where the connection portion 27 is provided (in FIG. 4, the first pipe is tilted upward and to the left). In the second pipe 232, the downstream portion where the connection pipe 37 is connected is positioned higher than the upstream portion where the connection pipe 35 is connected (in FIG. 4, the second pipe is tilted upward and to the right). In the third pipe 233, the downstream portion where the connection portion 29 is provided is positioned higher than the upstream portion where the connection pipe 37 is connected (in FIG. 4, the third pipe is tilted upward and to the left).

Therefore, in the variation example, the gas generated by electrolysis moves downstream of the regeneration unit 19 along the flow of the treatment liquid L and is then discharged from the third pipe 233 and sent together with the treatment liquid L to the downstream side via the return-side conduit 17. The gas is then discharged from the downstream end portion 17b of the return-side conduit 17 and collected if necessary. Gas venting may be also performed in the regeneration unit 19. More specifically, the pipe 23 or the connection pipes 35, 37 in the regeneration unit 19 may be provided with discharge ports for gas venting.

Second Embodiment

Figure 5:
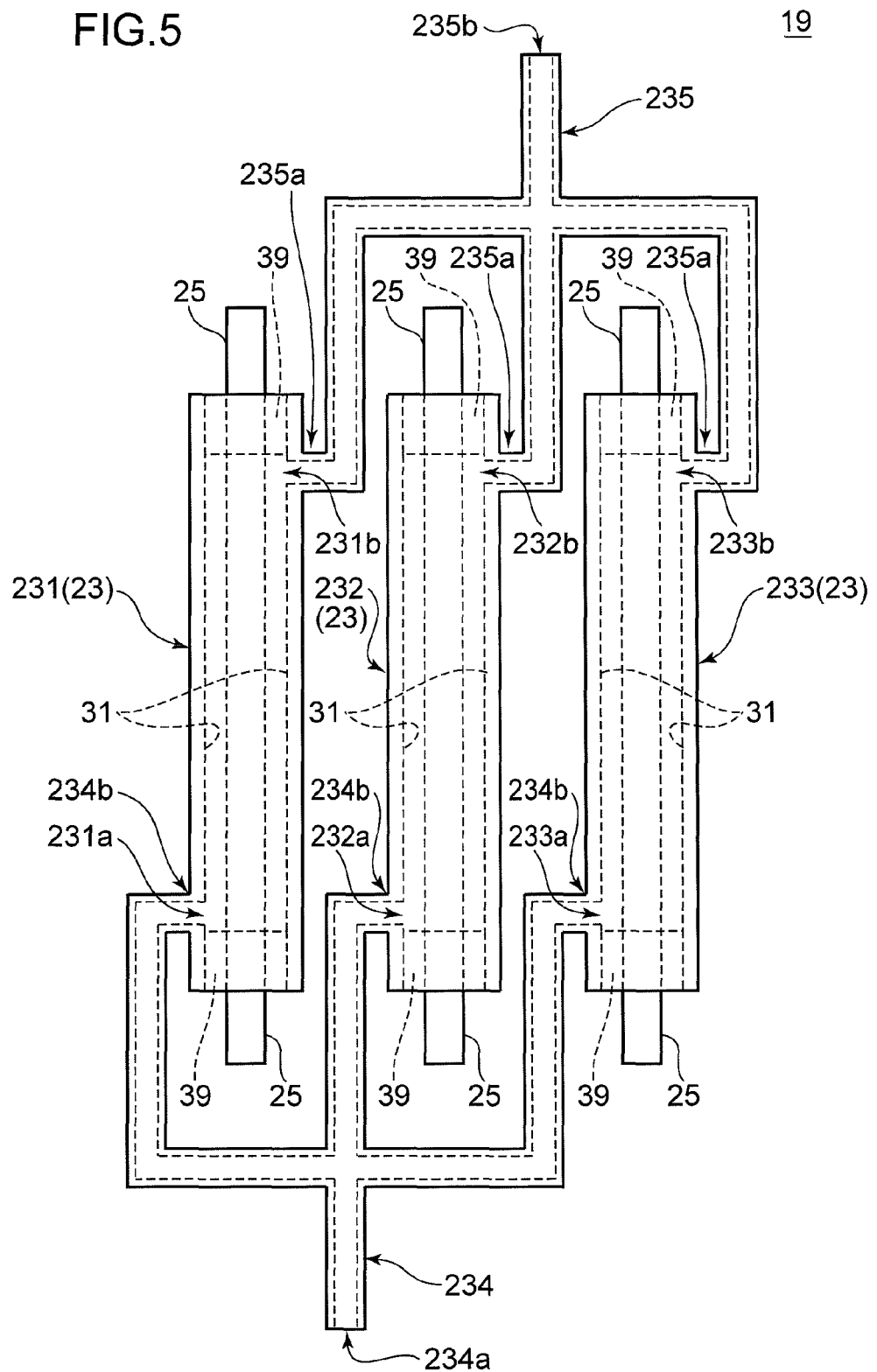
FIG. 5 is a schematic drawing illustrating the regeneration unit of the electrolytic regeneration device of the second embodiment of the present invention.

The electrolytic regeneration device 11 according to the second embodiment of the present invention will be explained below. FIG. 5 is a schematic drawing illustrating the regeneration unit of the electrolytic regeneration device 11 according to the second embodiment. The configuration of the electrolytic regeneration device 11 according to the second embodiment is similar to that of the first embodiment, with the exception of the regeneration unit 19, and the explanation thereof is herein omitted.

In the second embodiment, the treatment liquid L flowing in the feed-side conduit 15 is guided into the upstream end portion 231a of the first pipe 231, the upstream end portion 232a of the second pipe 232, and the upstream end portion 233a of the third pipe 233. The treatment liquid L then flows in the flow channel inside the pipe 23 from the upstream side to the downstream side and is discharged to the return-side conduit 17 from the downstream end portion 231b of the first pipe 231, the downstream end portion 232b of the second pipe 232, and the downstream end portion 233b of the third pipe 233.

As shown in FIG. 5, in the second embodiment, the regeneration unit 19 has an upstream branched pipe portion 234 connected to the upstream end portions 231a, 232a, 233a of the pipes 23 and a downstream branched pipe portion 235 connected to the downstream end portions 231b, 232b, 233b of the pipes 23.

The upstream branched pipe portion 234 has a structure including one pipe on the upstream side that is branched into three pipes on the downstream side of the one pipe. The downstream branched pipe portion 235 has a structure including one pipe on the downstream side that is branched into three pipes on the upstream side of the one pipe. The upstream end portion 234a of the upstream branched pipe portion 234 is connected to the downstream end portion 15b of the feed-side conduit 15. The downstream end portion 235b of the downstream branched pipe portion 235 is connected to the upstream end portion 17a of the return-side conduit 17. The three downstream end portions 234b of the upstream branched pipe portion 234 are connected to the upstream end portions 231a, 232a, 233a of the pipes 23. The three upstream end portions 235a of the downstream branched pipe portion 235 are connected to the downstream end portions 231b, 232b, 233b of the pipes 23.

The gap between the inner circumferential surface 31 of each pipe 23 and the cathode 25 serves as a flow channel for the treatment liquid L. The flow channel for the treatment liquid L is formed in each pipe 23 on the inner side in the longitudinal direction with respect to the sealing members 39. The inner space of the pipes 23, the inner space of the upstream branched pipe portion 234, and the inner space of the downstream branched pipe portion 235 communicate with the outside only through the upstream end portion 234a of the upstream branched pipe portion 234 and the downstream end portion 235b of the downstream branched pipe portion 235. The entire amount of the treatment liquid L that has flown into the pipes 23 via the upstream end portion 234a of the upstream branched pipe portion 234 flows out to the return-side conduit 17 via the downstream end portion 235b of the downstream branched pipe portion 235.

The pump 41 is provided in the feed-side conduit 15 in the same manner as in the first embodiment. Thus, the pump 41 is provided at a site in front of the branching location (site upstream of the branching portion). Therefore, the treatment liquid L can be pumped to each pipe 23 with one pump 41.

Further, in the second embodiment, when the flow velocity of the treatment liquid L flowing in the flow channel inside the pipes 23 is made equal to the flow velocity of the treatment liquid L flowing in the flow channel inside the pipes 23 in the first embodiment, the flow velocity of the treatment liquid L flowing in the feed-side conduit 15 and the return-side conduit 17 can be increased to about three times that attained in the first embodiment. As a result, in the second embodiment, the circulation amount of the treatment liquid L circulating between the regeneration unit 19 and the desmearing treatment tank 13 can be increased over that in the first embodiment.

Further, in the embodiment shown in FIG. 5, a case in which the regeneration unit 19 has the upstream branched pipe portion 234 and the downstream branched pipe portion 235 is explained by way of example, but the feed-side conduit 15 and the return-side conduit 17 may be also branched into a plurality of pipes. More specifically, in this case, the feed-side conduit 15 has three downstream end portions (not shown in the figure) formed by branching, and these downstream end portions are connected to the upstream end portions of the pipes 23. The return-side conduit 17 has three upstream end portions (not shown in the figure) formed by branching, and these upstream end portions are connected to the downstream portions of the pipes 23.

Third Embodiment

Figure 6:
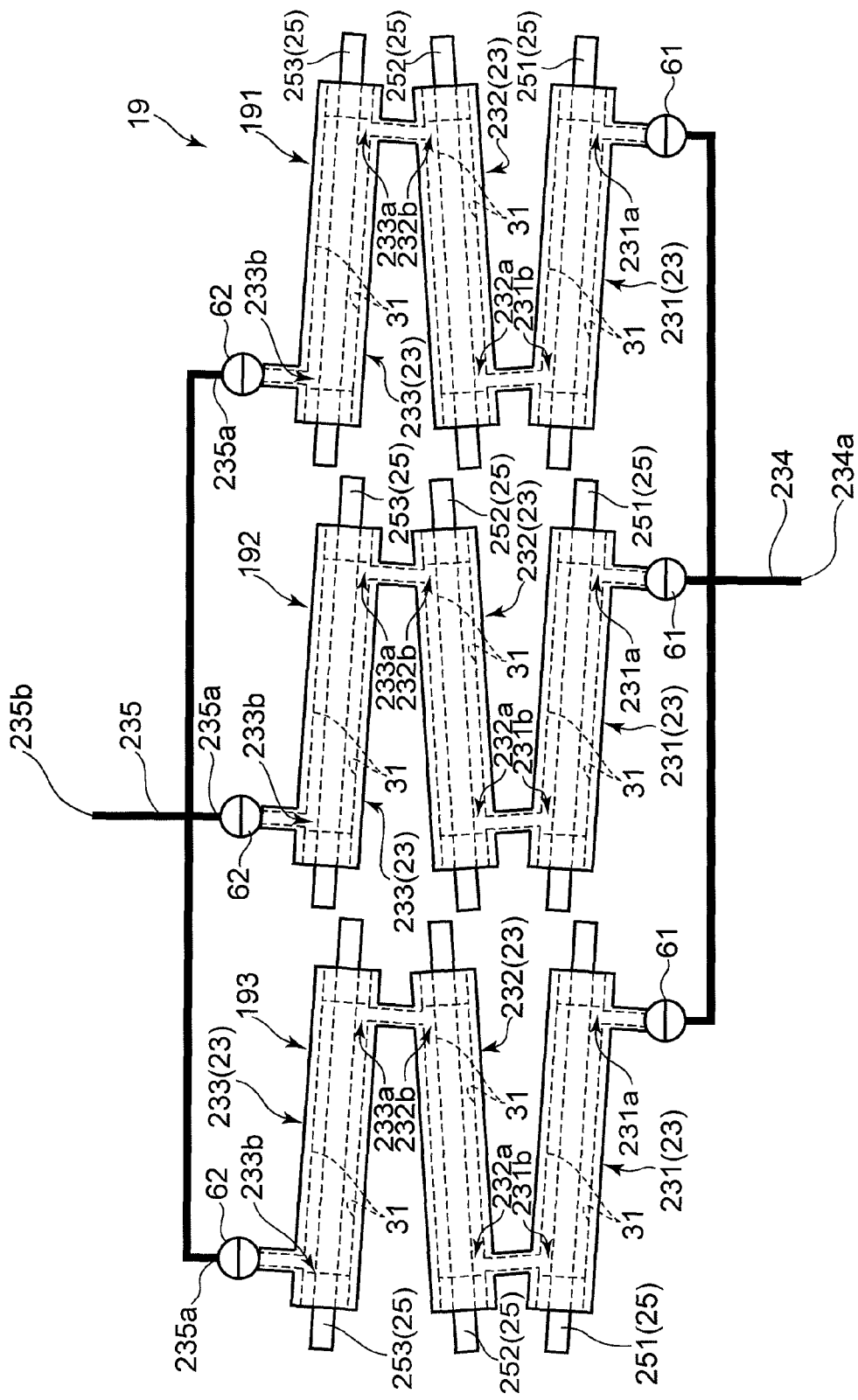
FIG. 6 is a schematic drawing illustrating the regeneration unit of the electrolytic regeneration device of the third embodiment of the present invention and the vicinity thereof.

FIG. 6 is a schematic drawing illustrating the regeneration unit 19 of the electrolytic regeneration device 11 according to the third embodiment of the present invention. As shown in FIG. 6, the electrolytic regeneration device 11 according to the third embodiment is provided with the regeneration unit 19, upstream branched pipe 234, downstream branched pipe 235, and opening-closing valves 61, 62. The regeneration unit 19 includes a first pipe block 191, a second pipe block 192, and a third pipe block 193. Each pipe block has a structure identical to that of the regeneration unit 19 shown in FIG. 4. The pipe blocks will be explained below in greater detail.

The first pipe block 191 includes three pipes 231, 232, 233 as tubular portions 23 and a total of three cathodes 25 installed by one cathode in a respective pipe. The three pipes of the first pipe block 191 are the upstream first pipe 231, central first pipe 232, and downstream first pipe 233. These pipes 231, 232, 233 are connected in series. The three cathodes 25 of the first pipe block 191 are an upstream first cathode 251, installed inside the pipe 231, a central first cathode 252 installed inside the pipe 232, and a downstream first cathode 253 installed inside the pipe 233.

The second pipe block 192 has a similar configuration. The three pipes are an upstream second pipe 231, a central second pipe 232, and a downstream second pipe 233 that are connected in series, and the three cathodes 25 are an upstream second cathode 251 installed inside the pipe 231, a central second cathode 252 installed inside the pipe 232, and a downstream second cathode 253 installed inside the pipe 233.

The third pipe block 193 has a similar configuration. The three pipes are an upstream third pipe 231, a central third pipe 232, and a downstream third pipe 233 that are connected in series, and the three cathodes 25 are an upstream third cathode 251 installed inside the pipe 231, a central third cathode 252 installed inside the pipe 232, and a downstream third cathode 253 installed inside the pipe 233.

The first pipe block 191, second pipe block 192, and third pipe block 193 are connected in parallel by the upstream branched pipe 234 and the downstream branched pipe 235. The upstream end portion 234a of the upstream branched pipe 234 is connected to the downstream end portion 15b of the feed-side conduit 15. The downstream end portion 235b of the downstream branched pipe portion 235 is connected to the upstream end portion 17a of the return-side conduit 17.

The treatment liquid L flowing in the feed-side conduit 15 is branched by the upstream branched pipe portion 234 and guided to the upstream end portion of the first pipe block 191, the upstream end portion of the second pipe block 192, and the upstream end portion of the third pipe block 193. The treatment liquid L that has passed through the pipe blocks is discharged from the downstream end portion of the first pipe block 191, the downstream end portion of the second pipe block 192, and the downstream end portion of the third pipe block 193. The discharged flows merge in the downstream branched pipe portion 235 and flow out to the return-side conduit 17.

The opening-closing valve 61 is provided between the upstream branched pipe 234 and the upstream end portion of each pipe block. The opening-closing valve 62 is provided between the downstream branched pipe 235 and the downstream end portion of each pipe block. The pipe blocks can be attached to and detached from the feed-side conduit 15 and return-side conduit 17. More specifically, the upstream end portion of each pipe block can be attached to and detached from a portion connected to the opening-closing vale 61, and the downstream end portion of each pipe block can be detached to and attached from a portion connected to the opening-closing valve 62.

The upstream branched pipe 234 has a structure including one pipe on the upstream side that is branched into three pipes on the downstream side of the one pipe. The downstream branched pipe 235 has a structure including one pipe on the downstream side that is branched into three pipes on the upstream side of the one pipe.

In the third embodiment, for example, when maintenance of the first pipe block 191 is performed, the opening-closing valves 61, 62 of the first pipe block 191 are closed and the first pipe block 191 is then taken off the opening-closing valves 61, 62. As the first pipe block 191 is being maintained, the second pipe block 192 and the third pipe block 193 can still be used for electrolytic regeneration.

Further, in the third embodiment, the pipes may be provided parallel to one another in each pipe block. Further, in the third embodiment, the pipes may be connected linearly in each pipe block.

Fourth Embodiment

Figure 7:
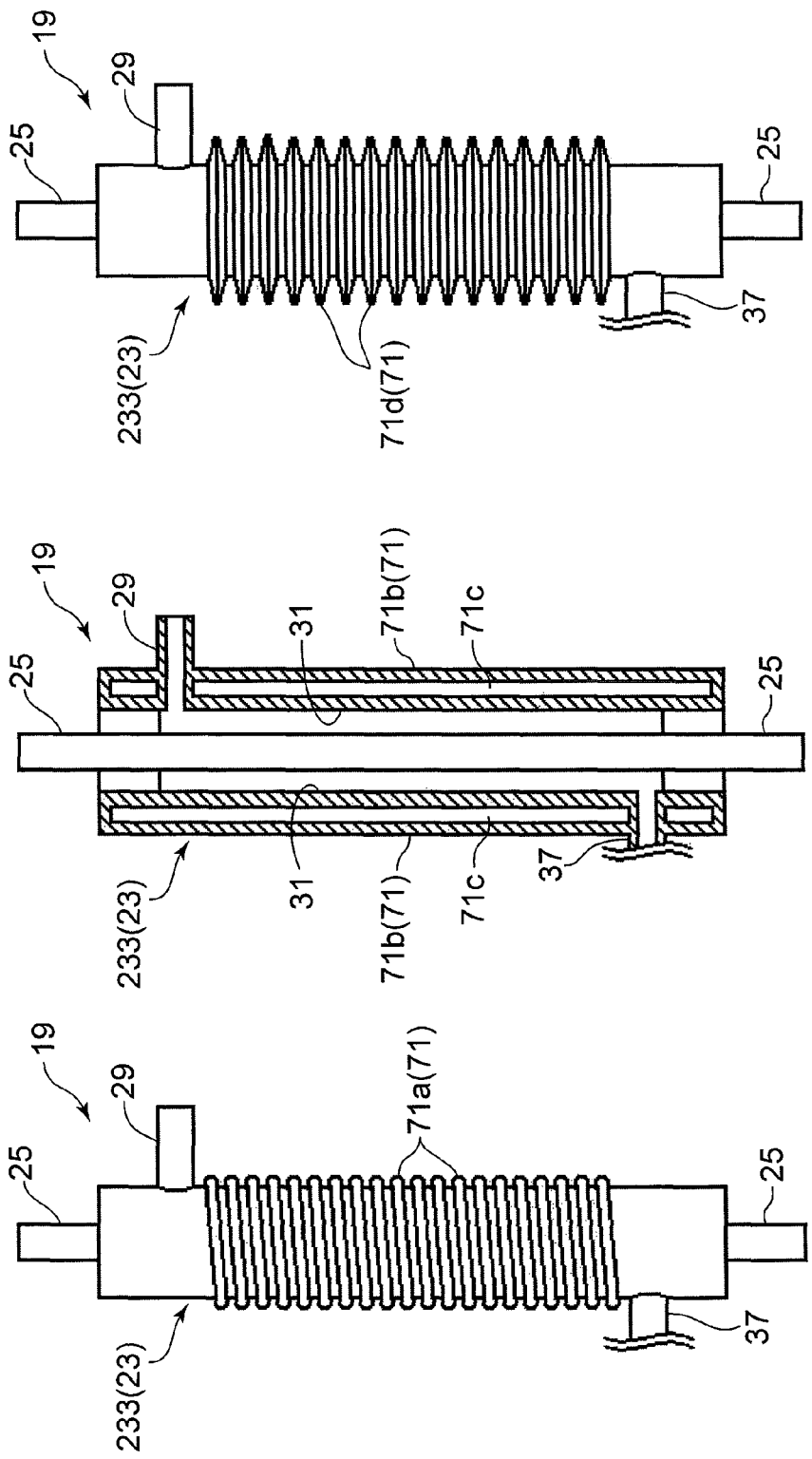
FIG. 7A is a schematic drawing illustrating the regeneration unit and temperature adjusting unit of the electrolytic regeneration device of the fourth embodiment of the present invention.
FIG. 7B is a cross-sectional view illustrating the variation example 1 of the regeneration unit and temperature adjusting unit.
FIG. 7C is a schematic drawing illustrating the variation example 2 of the regeneration unit and temperature adjusting unit.

FIG. 7A is a schematic drawing illustrating a temperature adjusting unit 71 of the regeneration unit 19 in the electrolytic regeneration device according to the fourth embodiment of the present invention. As shown in FIG. 7A, the temperature adjusting unit 71 in the fourth embodiment includes a tube 71a wound about each pipe (in FIG. 7A, the third pipe 233) of the tubular portion 23 and a feed mechanism (not shown in the figure). The inside of the tube 71a is a flow channel for a temperature adjusting fluid (heat medium) that is fed by the feed mechanism. As a result, each tubular portion 23 can be cooled and/or heated and therefore the temperature of the treatment liquid L flowing inside the tubular portion 23 can be adjusted to the desired range. A liquid such as water or a gas such as air can be used as the temperature adjusting fluid. The temperature adjusting unit 71 is preferably further provided with a path for circulating the temperature adjusting fluid.

FIG. 7B is a cross-sectional view illustrating the variation example 1 of the temperature adjusting unit 71. The temperature adjusting unit 71 of the variation example 1 includes a jacket 71b provided at each pipe (in FIG. 7B, the third pipe 233) of the tubular portion 23 and a feed mechanism (not shown in the figure). The jacket 71b covers substantially the entire outer surface of the tubular portion 23, with a predetermined gap 71c being left between the jacket and the outer surface of each tubular portion 23. The gap 71c is a flow channel for the temperature adjusting fluid fed by the feed mechanism. As a result, each tubular portion 23 can be cooled and/or heated. The temperature adjusting unit 71 is preferably further provided with a path for circulating the temperature adjusting fluid. The jacket 71b may be molded integrally with the tubular portions 23, or may be molded as a separate body and then attached to the tubular portions 23.

FIG. 7C is a schematic view illustrating the variation example 2 of the temperature adjusting unit 71. The temperature adjusting unit 71 of the variation example 2 includes fins 71d provided on the outer surface of the pipe (in FIG. 7C, the third pipe 233) of the tubular portions 23. The fins 71d are configured by a multiplicity of protruding pieces that protrude radially outward from the outer surface of each tubular portion 23. The adjacent protruding pieces are disposed at a distance from each other. The fins 71d may be molded integrally with the tubular portions 23, or may be molded as a separate body and then attached to the tubular portions 23.

Since the fins 71d have a large surface area, the efficiency of heat exchange with the fluid (air or the like) surrounding the tubular portions 23 can be increased. As a result, each tubular portion 23 can be cooled. By feeding hot air or the like to the fins 71d, it is also possible to heat the tubular portions 23. Further, it is preferred that the temperature adjusting unit 71 be further provided with a blower (not shown in the figure) for blowing air to the fins 71d. As a result, the efficiency of temperature adjustment can be further increased.

Figure 8:
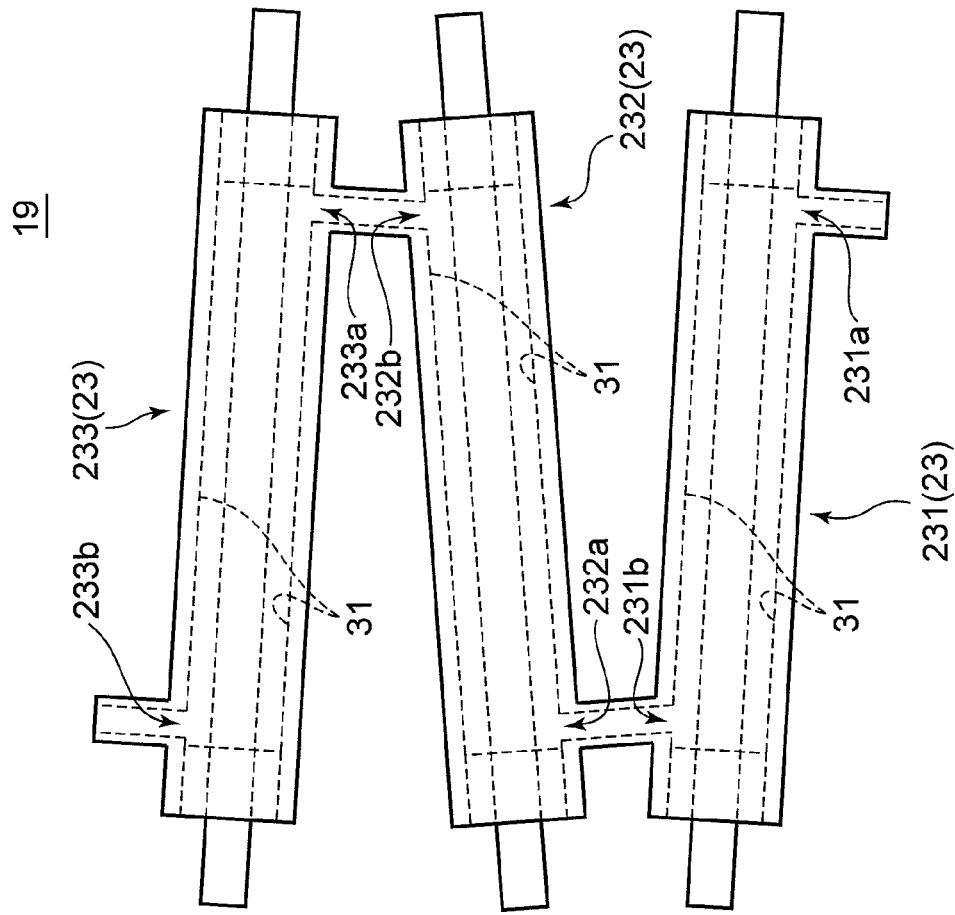
FIG. 8 is a schematic drawing illustrating the variation example 3 of the regeneration unit and temperature adjusting unit in the fourth embodiment.

FIG. 8 is a schematic drawing illustrating the variation example 3 of the temperature adjusting unit. In the variation example 3, a cooling fan 71e is disposed as the temperature adjusting unit 71 in the vicinity of the regeneration unit 19. The cooling fan 71e can cool the tubular portions 23 of the regeneration unit 19 by blowing air to the regeneration unit 19.

Fifth Embodiment

Figure 9:
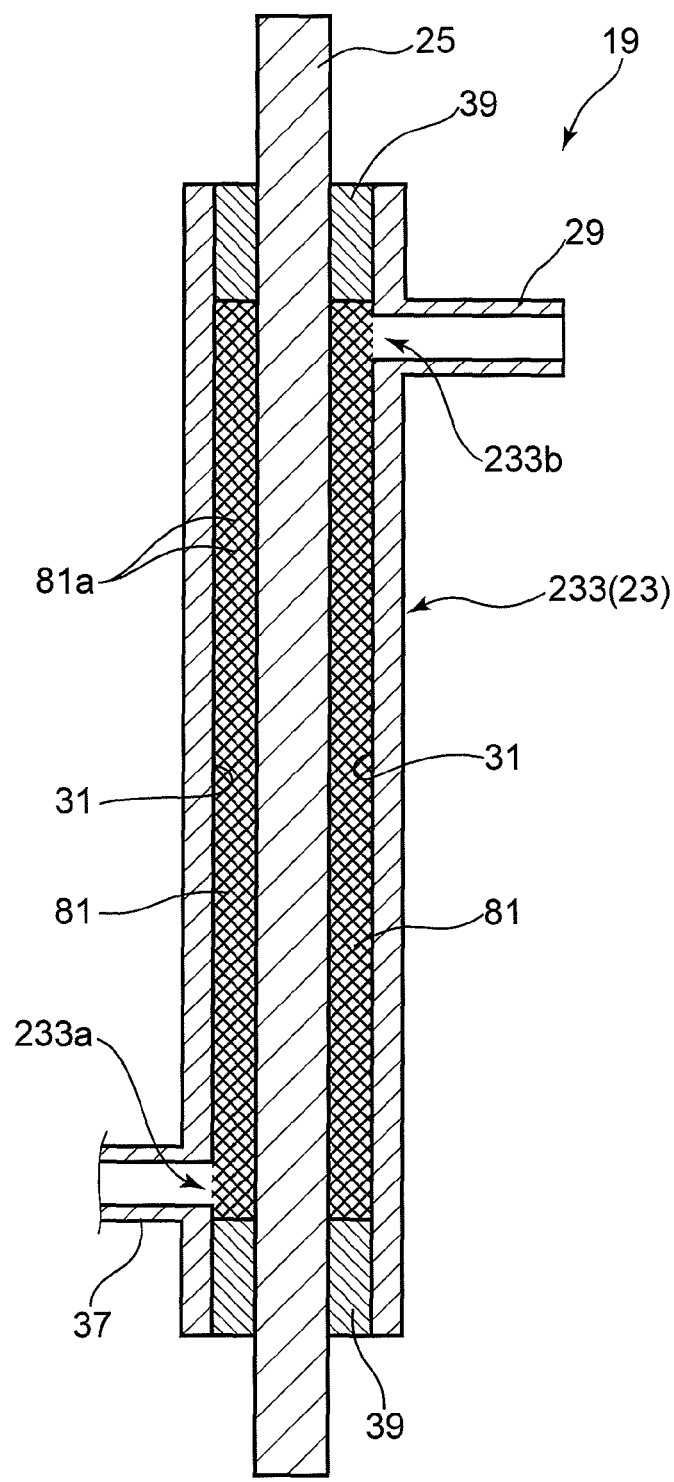
FIG. 9 is a cross-sectional view illustrating the regeneration unit of the electrolytic regeneration device of the fifth embodiment of the present invention.
Figure 10A:
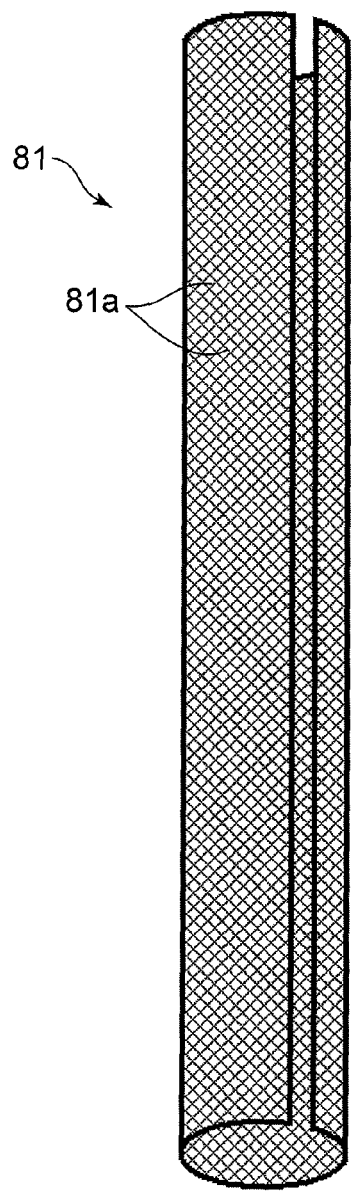
FIG. 10A is a perspective view illustrating an example of the auxiliary anode in the fifth embodiment.
Figure 10B:
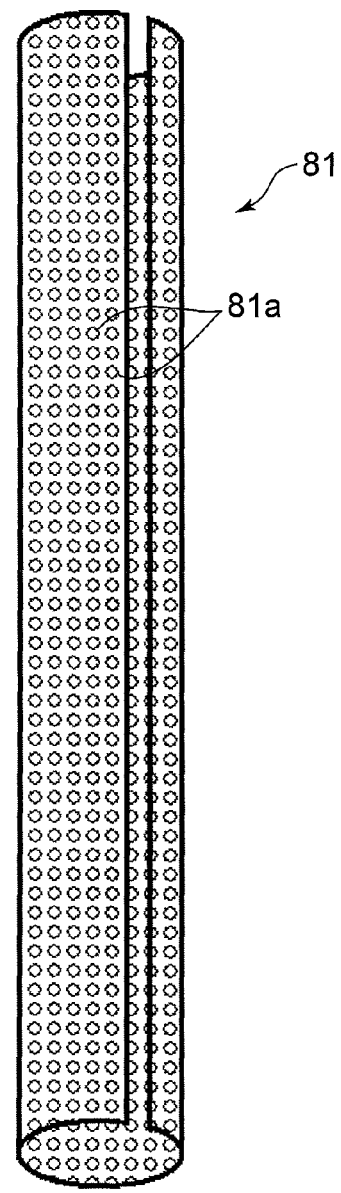
FIG. 10B is a perspective view illustrating another example of the auxiliary anode in the fifth embodiment.

FIG. 9 is a schematic drawing illustrating the regeneration unit 19 of the electrolytic regeneration device 11 according to the fifth embodiment of the present invention. FIG. 10A is a perspective view illustrating an example of an auxiliary anode 81 in the fifth embodiment. FIG. 10B is a perspective view illustrating another example of the auxiliary anode 81 in the fifth embodiment.

The regeneration unit 19 according to the fifth embodiment is provided with the auxiliary anode 81. FIG. 9 shows a state in which the auxiliary anode 81 is provided inside the third pipe 233 of the regeneration unit 19 shown in FIG. 2. The auxiliary anode 81 is also provided inside the first pipe 231 and the second pipe 232 (this is not shown in the figure).

The auxiliary anode 81 is disposed opposite the cathode 25 in a state of separation from the cathode 25. The auxiliary anode 81 has a tubular shape extending along the cathode 25 so as to surround the circumference of the cathode 25. The auxiliary anode 81 is in contact with the inner circumferential surface 31 of the tubular portion 23. Because of such contact with the inner circumferential surface 31 of the tubular portion 23, the auxiliary anode 81 is electrically connected to the inner circumferential surface 31 of the tubular portion 23.

The auxiliary anode 81 is provided from the position corresponding to the upstream end portion 233a of the tubular portion 23 to the position corresponding to the downstream end portion 233b in the longitudinal direction of the cathode 25. A plurality of through holes 81a is formed over the entire auxiliary anode 81. Since the through holes 81a are thus provided, the treatment liquid L that has reached the auxiliary anode 81 via the connection pipe 37 can flow into the auxiliary anode 81 via the through holes 81a. After the treatment liquid L has been subjected to the electrolytic regeneration treatment inside the tubular portions 23, the treatment liquid can flow to the outer side of the auxiliary anode 81 via the through holes 81a and then flow to the outside of the tubular portion 23 from the connection portion 29.

For example, a mesh-like conductive sheet rounded into a cylindrical shape as shown in FIG. 10A and a sheet (punching sheet) obtained by forming a plurality of through holes 81a in a conductive sheet as shown in FIG. 10B can be used as the auxiliary anode 81 provided with the plurality of through holes 81a. The auxiliary anode 81 is formed from a conductive material. The material constituting the conductive sheet can be, for example, a metal such as stainless steel and copper, but is not limited thereto, and other metals may be also used or conductive materials other than metals may be also used. SUS 316 is an example of stainless steel.

Prior to attaching the cathode 25 to the tubular portion 23, the auxiliary anode 81 is inserted into the tubular portion 23 from the opening of the tubular portion 23. Then, the cathode 25 is attached to the end portion of the tubular portion 23.

In the fifth embodiment, the case is considered by way of example in which the plurality of through holes 81a is formed in the entire auxiliary anode 81, but such a configuration is not limiting. The plurality of through holes 81a may be formed only in a portion of the auxiliary anode 81.

Sixth Embodiment

Figure 11:
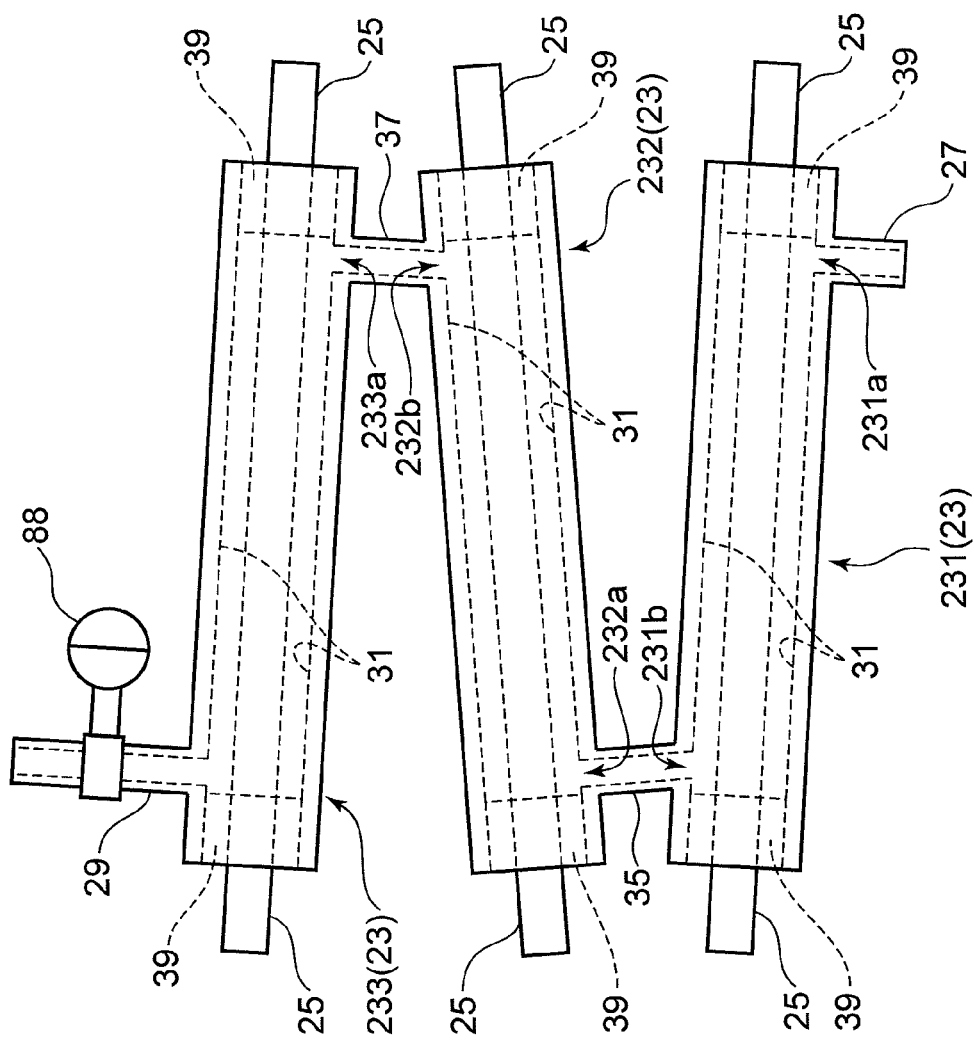
FIG. 11 is a schematic drawing illustrating the regeneration unit and gas discharge valve of the electrolytic regeneration device of the sixth embodiment of the present invention.

FIG. 11 is a schematic drawing illustrating the regeneration unit 19 of the electrolytic regeneration device of the sixth embodiment of the present embodiment. As shown in FIG. 11, in the sixth embodiment, the regeneration unit 19 shown in FIG. 4 is further provided with a gas discharge valve 88. The gas discharge valve 88 is provided in the connection portion 29.

In each pipe of the tubular portion 23, the manganate contained in the treatment liquid L is regenerated into the permanganate by electrolytic regeneration of the treatment liquid L, but sludge including manganese dioxide ($MnO_2$) as the main component is generated on the surface of the cathode 25. In order to remove this sludge from the surface of the cathode 25, it is preferred that the cathode 25 be washed by periodically passing a hydrogen peroxide solution through the regeneration unit 19. Where such washing is performed, a gas is generated by a chemical reaction.

In the sixth embodiment, since the gas discharge valve 88 is provided, the gas generated by the washing can be discharged to the outside of the regeneration unit 19. For example, a pressure valve that is opened when the pressure inside the connection portion 29 exceeds the predetermined value or an automatically controlled electromagnetic valve can be used as the gas discharge valve 88.

In particular, in the regeneration unit 19 of the sixth embodiment, as shown in FIG. 11, the connection portion 29 and the gas discharge valve 88 are disposed so as to be positioned in the upper portion. Therefore, the gas generated in each pipe of the tubular portion 23 is fed upward together with the treatment liquid L along the flow direction of the treatment liquid L and reaches the connection portion 29. Therefore, the generated gas is unlikely to be retained inside the tubular portion 23.

For example, a method by which a hydrogen peroxide solution is introduced instead of the treatment liquid L into the desmearing treatment tank 13 and the hydrogen peroxide solution is caused to flow in the regeneration unit 19 in the same manner as in the case of forced circulation of the treatment liquid L.

Seventh Embodiment

Figure 12:
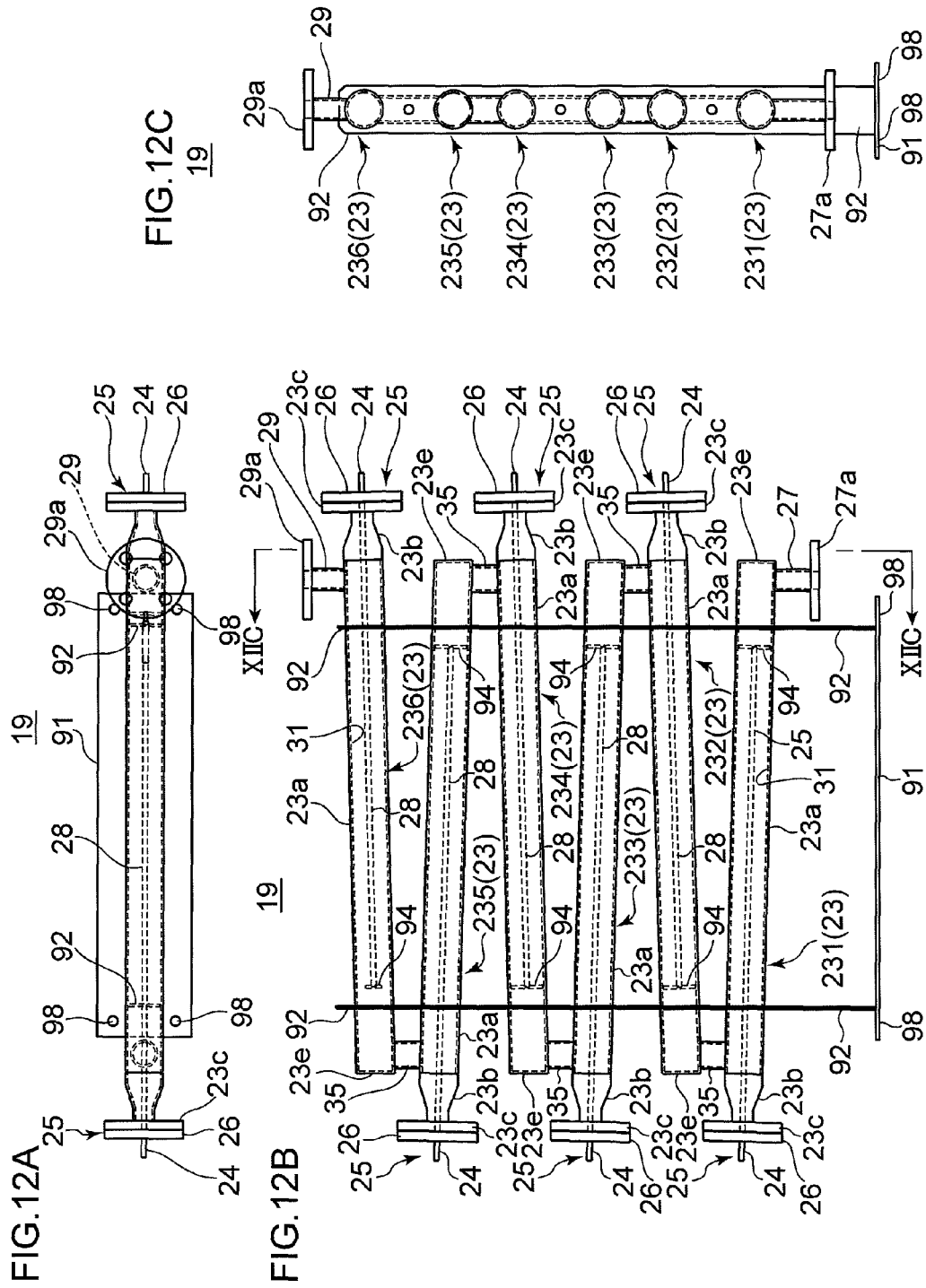
FIG. 12A is a plan view illustrating the regeneration unit of the electrolytic regeneration device of the seventh embodiment of the present invention.
FIG. 12B is a front view of the configuration shown in FIG. 12A.
FIG. 12C is a cross-sectional view taken along the XIIC-XIIC line in FIG. 12B.
Figure 13:
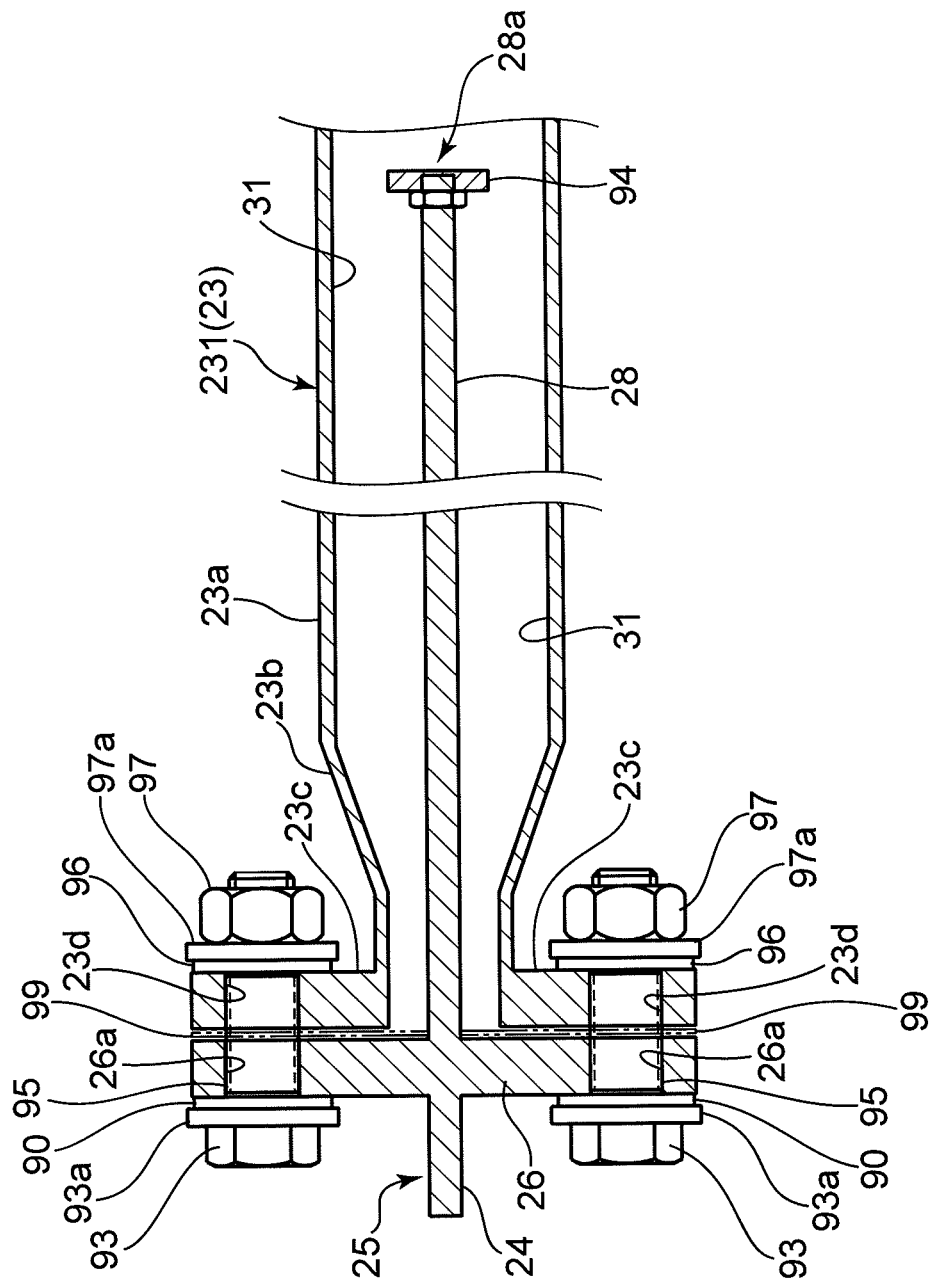
FIG. 13 is a cross-sectional view illustrating the regeneration unit of the seventh embodiment.

FIG. 12A is a plan view illustrating the regeneration unit 19 of the electrolytic regeneration device 11 of the seventh embodiment of the present invention. FIG. 12B is a front view thereof. FIG. 12C is a cross-sectional view taken along the XIIC-XIIC line in FIG. 12B. FIG. 13 is a cross-sectional view illustrating the regeneration unit 19 of the seventh embodiment.

In the regeneration unit 19 of the seventh embodiment, each pipe of the tubular portion 23 has an opening at one end in the extension direction, and the other end in the extension direction is closed. The cathode 25 in the regeneration unit 19 includes a base portion 26 attached to the end portion of each pipe of the tubular portion 23, an extending portion 28 inserted from the opening of the pipe into the pipe and extending from the base portion 26 along the extension direction of the pipe, and a wiring connection portion 24 extending from the outer surface of the base portion 26 in the direction perpendicular to the outer surface.

The tubular portion 23 of the regeneration unit 19 includes six pipes and these pipes are connected in series. Each pipe of the tubular portion 23 has a cylindrical shape. Each pipe of the tubular portion 23 has a cylindrical pipe body main portion 23a occupying a larger region of the pipe in the longitudinal direction (extension direction), a flange portion 23c provided at one end of the pipe in the longitudinal direction, and a reduced diameter portion 23b connecting the flange portion 23c and the pipe body main portion 23a to each other.

The other end 23e, in the longitudinal direction, of each pipe of the tubular portion 23, that is, the other end 23e of the pipe body main portion 23a, is closed, rather than open. The flange portion 23c is an annular zone expanding radially outward so as to surround the pipe opening. The reduced diameter portion 23b plays the role of reducing the inner diameter and outer diameter of the pipe to less than those of the pipe body main portion 23a in the vicinity of one end of the pipe. As a result, the outer diameter of the flange portion 23c can be reduced and therefore compact pipes can be formed. Further, since the diameter of the opening can be reduced, the effect of preventing the leak can be increased.

A connection portion 27 extending downward from the lower surface of the pipe body main portion 23a is provided in a location on the other end 23e side of the downmost first pipe 231. The connection portion 27 is connected to the downstream end portion 15b of the feed-side conduit 15 in the same manner as in the above-described embodiments. A flange portion 27a is provided at the distal end of the connection portion 27 and disposed opposite a flange portion (not shown in the figure) provided at the downstream end portion 15b of the feed-side conduit 15. The two flanges are joined together by bolts and nuts (not shown in the figure). The downstream portion of the first pipe 213 is connected by a connection pipe 35 to an upstream portion (portion on the other end 23e side of the second pipe 232) of the second pipe 232 positioned thereabove.

In the second pipe 232 and the third pipe 233 positioned thereabove, the downstream portion of the second pipe 232 and the upstream portion of the third pipe 233 (portion on the other end 23e side of the third pipe 233) are connected to one another by the connection pipe 35 similar to that mentioned hereinabove. The adjacent pipes are thereafter connected together in a similar manner.

A connection portion 29 extending upward from the upper surface of the pipe body main portion 23a is provided at a downstream portion of the uppermost sixth pipe 236. The connection portion 29 is connected to the upstream end portion 17a of the return-side conduit 17 in the same manner as in the above-described embodiments. A flange portion 29a is provided at the connection portion 29 in the same manner as at the connection portion 27.

Each pipe of the tubular portion 23 is formed from a conductive material, and the inner circumferential surface 31 functions as an anode. For example, a metal material such as stainless steel and copper can be used as the conductive material, but these metals are not limiting and other metals may be also used. Conductive materials other than metals may be also used. The stainless steel is for example SUS316 that excels in chemical resistance such as alkali resistance.

As shown in FIG. 13, the base portion 26 of the cathode 25 is attached to the flange portion 23c of the pipe and closes the opening of the pipe. The extending portion 28 extends from the base portion 26 along the extension direction of the pipe body main portion 23a. The wiring connection portion 24 is connected to the wiring of the rectifier 21. The base portion 26, extending portion 28, and wiring connection portion 24 are formed integrally.

The base portion 26 has a disk-like shape with an outer diameter about equal to that of the flange portion 23c of the pipe. The base portion 26 is disposed opposite the flange portion 23c, with a disk-shaped insulating packing 99 being interposed therebetween. The insulating packing has an outer diameter about equal to that of the base portion 26.

A plurality of screw insertion holes 26a is formed along the circumferential direction in the base portion 26. A plurality of screw insertion holes 23d is formed in the flange portion 23c at positions corresponding to the screw insertion holes 26a of the base portion 26. The positions of these screw insertion holes 26a, 23d are matched and cylindrical insulating sleeves 95 are inserted into these screw insertion holes 26a, 23d. Bolts 93 are inserted into the insulating sleeves 95, and nuts 97 are screwed on the distal ends of the bolts.

A cylindrical insulating washer 90 and a cylindrical washer 93a are interposed between the bolt 93 and the base portion 26. A cylindrical insulating washer 96 and a cylindrical washer 97a are interposed between the nut 97 and the flange portion 23c. The opening of the pipe is thus liquid-tightly closed by the base portion 26 and the insulating packing 99. For example, materials having insulating properties can be used to constitute the insulating members. Examples of suitable materials include synthetic resins and synthetic rubber. Polytetrafluoroethylene is an example of suitable synthetic resin.

The extending portion 28 extends from the inner surface of the base portion 26 in the direction perpendicular to this inner surface. The extending portion 28 is disposed so as to pass almost through the center of the pipe body main portion 23a and separated from the inner circumferential surface 31 of the pipe. The extending portion 28 extends to a position beyond the center in the longitudinal direction of the pipe body main portion 23a. The extending portion 28 extends to the vicinity of the other end 23e of the pipe. The extending portion 28 has a rod-like or plate-like shape.

An insulating member 94 for preventing contact between the extending portion 28 and the inner circumferential surface 31 of the pipe is attached to the extending portion 28. This insulating member 94 extends from the extending portion 28 in the direction toward the inner circumferential surface 31 of the pipe. When the extending portion 28 is long, the extending portion 28 can be easily bent by gravity or pressure induced by the flow of the treatment liquid L. Therefore, it is preferred that the insulating member 94 be provided at the distal end 28a of the extending portion 28 or in the vicinity thereof.

The insulating member 94 extends from the distal end 28a of the extending portion 28 radially outward of the pipe main body portion 23a. The insulating member 94 may have a shape extending from the extending portion 28 in a rod-like fashion to both sides toward the inner circumferential surface 31 of the pipe body main portion 23a, a shape extending radially (for example, in a cross-like fashion) from the extending portion 28 toward the inner circumferential surface 31 of the pipe body main portion 23a, or a disk-like shape, but from the standpoint of ensuring smooth flow of the treatment liquid L in the pipe body main portion 23a, the rod-like or radial shape is preferred.

In the seventh embodiment, the insulating member 94 is provided at the distal end of the extending portion 28, but the insulating member 94 should not necessarily be provided at the distal end of the extending portion 28. When the long extending portion 28 has undergone bending deformation, the displacement of the distal end of the extending portion 28 is the largest. Therefore, in the present embodiment, an insulating member 94 is provided at the distal end of the extending portion 28.

In the regeneration unit 19 of the seventh embodiment, as described hereinabove, a plurality of pipes is connected in series, thereby forming as a whole a single channel having a zigzag shape (serpentine shape) as shown in FIG. 12B. The regeneration unit 19 is supported by a support member in a posture shown in FIG. 12B. The support member has a plane-shaped base member 91 and a pair of rising portions 92, 92 that extend upward from both sides of the base member 91. A total of six through holes (not shown in the figure) for supporting the pipes inserted therein are formed in one rising portion 92, and a total of six through holes (not shown in the figure) for supporting the pipes inserted therein are formed in the other rising portion 92. The base member 91 has through holes 98 for inserting bolts in four corners thereof and is fixed with bolts (not shown in the figure) in the desired location inside the device.

Further, in the seventh embodiment, the pipes of the tubular portion 23 are disposed so that longitudinal direction thereof is tilted slightly with respect to the horizontal direction. More specifically, in the first pipe 231 shown in FIG. 12B, the downstream portion where the connection pipe 35 is connected is positioned higher than the upstream portion where the connection portion 27 is provided (in FIG. 12B, the pipe is tilted upward and to the left). In the second pipe 232, the downstream portion is positioned higher than the upstream portion (in FIG. 12B, the second pipe 232 is tilted upward and to the right). Likewise, in the third to sixth pipes 233 to 236, the downstream portion is positioned higher than the upstream portion.

The inclination angle of each pipe of the tubular portion 23, that is, the angle $\theta$ formed by the longitudinal direction (extension direction) of the pipe with the horizontal direction, is 3 degrees in the state shown in FIG. 12B, but this value is not limiting. The merit of increasing the angle $\theta$ is that the gas located inside the pipe can move easier to the downstream side. The merit of decreasing the angle $\theta$ is that the size of the regeneration unit 19 in the vertical direction can be reduced.

In the state shown in FIG. 12B, the angle formed between the adjacent pipes in the tubular portion 23, that is, the angle formed between the longitudinal directions of the pipes, is 6 degrees, but this value is not limiting. Where reducing the regeneration unit 19 in size is a priority, the adjacent pipes may be disposed parallel to each other, or one of the pipes may be tilted with respect to the other pipe so that the angle therebetween becomes about several degrees (for example, greater than 0 degrees and less than 10 degrees). Where facilitating the movement of the gas located inside the tubular portion 23 to the downstream side is a priority, one pipe may be tilted with respect to the other pipe so that the angle formed by the adjacent pipes is an acute angle, more specifically, an angle for example, equal or greater than 10 degrees and less than 90 degrees.

In the seventh embodiment, the case is shown by way of example in which the first pipe is disposed at the lowermost position and the sixth pipe is disposed at the uppermost position (the regeneration unit 19 is disposed in the vertical direction), as shown in FIG. 12B, but such configuration is not limiting. For example, the regeneration unit 19 may be disposed horizontally so that the pipes are at the same height, or the regeneration unit 19 may be tilted with respect to the horizontal direction.

Further, in the seventh embodiment, one end of each pipe of the tubular portion 23 is open and the other end is closed, but both ends may be open.

Summary of the Embodiments

As described hereinabove, in the embodiments, the downstream end portion 15b of the feed-side conduit 15 is connected to the pipe 23 serving as a tubular portion in the regeneration unit 19. Therefore, the treatment liquid L discharged from the desmearing treatment tank 13 flows directly into the pipe 23 through the feed-side conduit 15. Further, the treatment liquid L that has flown into the pipe 23 is electrolyzed and regenerated while being fed through the gap between the inner circumferential surface 31 of the pipe 23 and the cathode 25. The treatment liquid L that has been regenerated and discharged from the regeneration unit 19 is guided through the return-side conduit 17 into the desmearing treatment tank 13.

Therefore, in the above-mentioned embodiment, the electrolytic regeneration tank such as used in the conventional device is unnecessary. Therefore, the electrolytic regeneration device can be reduced in size and the installation area of the device can be reduced. In addition, the bath volume can be decreased.

Further, when the electrolytic regeneration tank is used as in the conventional configuration, the bath volume of the electrolytic regeneration tank is large and the flow velocity of the treatment liquid L flowing around the cathode and anode is small. Therefore, the treatment liquid located around the cathode and anode is not sufficiently replaced and the electrolysis is not performed with good efficiency. By contrast, in the aforementioned embodiments, the treatment liquid L discharged from the desmearing treatment tank 13 directly flows into the pipe 23 through the feed-side conduit 15 and fed through a gap between the inner circumferential surface 31 of the pipe 23 and the cathode 25. Therefore, in the aforementioned embodiments, the treatment liquid L flows along the cathode 25 and the anode 31. As a consequence, the treatment liquid L located around the cathode 25 and the anode 31 is efficiently replaced and electrolyzed with good efficiency.

In the aforementioned embodiments, the treatment liquid L flows directly from the feed-side conduit 15 into the pipe 23 and the treatment liquid L flows in the gap (flow channel) between the pipe 23 and the cathode 25. Therefore, the flow velocity of the treatment liquid L flowing in the flow channel can be increased. Further, the treatment liquid L flows along the longitudinal direction of the cathode 25. As a result, sludge generated at the surface of the cathode 25 is pushed out by the flow of the treatment liquid L easier than in the conventional configuration. As a result, the sludge is unlikely to remain on the cathode 25. The sludge pushed out from the surface of the cathode 25 is trapped by the aforementioned filter 43 or the like. Therefore, the device can be stably operated over a long period, with the filter 43 being periodically replaced.

Further, in the aforementioned embodiments, maintenance of the electrodes is facilitated. For example, by providing valves or the like upstream and downstream of the pipes and closing these valves, it is possible to take the pipes and cathodes off the device. The removed pipes and cathodes can be replaced and the operation of removing the sludge adhered to the cathode can be easily performed.

Further, in the first embodiment, the first pipe 231, second pipe 232, and third pipe 233 form a single flow channel through which the treatment liquid L flows. These pipes 23 are juxtaposed so as to be parallel to each other. Therefore, in the first embodiment, the length of the pipes in the extension direction can be reduced, while maintaining about the same efficiency of electrolytic regeneration, by comparison with the case in which a flow channel with a length equal to a sum total of the flow channel length of the first pipe 231, second pipe 232, and third pipe 233 is formed by a single pipe.

In the variation example of the first embodiment, the first pipe 231, second pipe 232, and third pipe 233 form a single flow channel and the downstream pipe 23 is disposed above the upstream pipe 23. Therefore, the gas generated by electrolysis of the treatment liquid L in the regeneration unit 19 can rise inside the regeneration unit 19, while moving along the flow of the treatment liquid L, without flowing counter to the flow direction of the treatment liquid L. As a result, the gas generated by electrolysis moves smoothly to the downstream side of the regeneration unit 19 along the flow of the treatment liquid L and is therefore prevented from being retained inside the regeneration unit 19.

Further, in the second embodiment, the treatment liquid L before the electrolytic regeneration that has a high concentration of manganate can be caused to flow into the first pipe 231, second pipe 232, and third pipe 233. Therefore, the efficiency of electrolytic regeneration treatment can be increased over that in the first embodiment in which the first pipe 231, second pipe 232, and third pipe 233 form a single flow channel.

In the variation example of the first embodiment and also the sixth embodiment and seventh embodiment, the tubular portion includes a first pipe having an inner circumferential surface functioning as an anode and a second pipe having an inner circumferential surface functioning as an anode, and the cathode includes a first cathode that is provided inside the first pipe and extends along the extension direction of the first pipe in a state of separation from the inner circumferential surface of the first pipe, and a second cathode that is provided inside the second pipe and extends along the extension direction of the second pipe in a state of separation from the inner circumferential surface of the second pipe, wherein the downstream end portion of the feed-side conduit is connected to the upstream end portion of the first pipe, the downstream end portion of the first pipe is connected to an upstream end portion of the second pipe, and the second pipe is provided to be tilted with respect to the first pipe, so that the extension direction of the second pipe forms an acute angle with the extension direction of the first pipe.

With such a configuration, since the downstream end portion of the first pipe is connected to the upstream end portion of the second pipe, the first pipe and second pipe form a single flow channel through which the treatment liquid flows. Thus, in the aforementioned single flow channel, the upstream end portion of the first pipe connected to the downstream end portion of the feed-side conduit serves as an inlet port for the treatment liquid and the treatment liquid flows through the downstream end portion of the first pipe, the upstream end portion of the second pipe, and the downstream end portion of the second pipe in the order of description. Further, the second pipe is provided to be tilted with respect to the first pipe, so that the extension direction of the second pipe forms an acute angle with the extension direction of the first pipe. Therefore, with such a configuration, the length of the pipes in the extension direction can be reduced, while maintaining about the same efficiency of electrolytic regeneration, by comparison with the case in which a linear flow channel with a length equal to a sum total of the flow channel length of the first pipe and the flow channel length of the second pipe is formed by a single pipe.

In the variation example of the first embodiment and also the sixth embodiment and seventh embodiment, the second pipe is disposed above the first pipe, the first pipe is tilted with respect to the horizontal direction so that the downstream end portion thereof is higher than the upstream end portion thereof, and the second pipe is tilted with respect to the horizontal direction so that the downstream end portion thereof is higher than the upstream end portion thereof.

With such a configuration, since the second pipe located on the downstream side is disposed above the first pipe located on the upstream side, the gas generated by electrolysis of the treatment liquid in the regeneration unit can rise inside the regeneration unit, while moving along the flow of the treatment liquid, without flowing counter to the flow direction of the treatment liquid. As a result, the gas generated by electrolysis moves smoothly to the downstream side of the regeneration unit along the flow of the treatment liquid and is therefore prevented from being retained inside the regeneration unit. Furthermore, in the above-described configuration, since the pipes are tilted with respect to the horizontal direction as described hereinabove, the gas can move even smoother inside the pipes toward the downstream side.

In the third embodiment, the tubular portion includes the first pipe block in which the upstream first pipe having an inner circumferential surface functioning as an anode and the downstream first pipe having an inner circumferential surface functioning as an anode are connected in series, and the second pipe block in which the upstream second pipe having an inner circumferential surface functioning as an anode and a downstream second pipe having an inner circumferential surface functioning as an anode are connected in series, the cathode includes the upstream first cathode provided inside the upstream first pipe and extending along an extension direction of the upstream first pipe in a state of separation from the inner circumferential surface of the upstream first pipe, the downstream first cathode provided inside the downstream first pipe and extending along the extension direction of the downstream first pipe in a state of separation from the inner circumferential surface of the downstream first pipe, the upstream second cathode provided inside the upstream second pipe and extending along the extension direction of the upstream second pipe in a state of separation from the inner circumferential surface of the upstream second pipe, and the downstream second cathode provided inside the downstream second pipe and extending along the extension direction of the downstream second pipe in a state of separation from the inner circumferential surface of the downstream second pipe, and the first pipe block and the second pipe block are juxtaposed with each other such that the treatment liquid flowing in the feed-side conduit is guided into the upstream end portion of the first pipe block and into the upstream end portion of the second pipe block and the treatment liquid is discharged into the return-side conduit from the downstream end portion of the first pipe block and the downstream end portion of the second pipe block.

With such a configuration, the pipe blocks are used in which because the upstream pipe and the downstream pipe are connected in series, the flow channel length is increased and electrolytic regeneration capacity is improved over those attained in the case in which a single pipe is used (only the upstream pipe or only the downstream pipe). Further, a regeneration unit can be constructed by using the number of the aforementioned pipe blocks that corresponds to the necessary electrolytic regeneration capacity. In this case, the first pipe block and the second pipe block are connected in parallel so that the treatment liquid flowing in the feed-side conduit is guided to the upstream end portion of the first pipe block and the upstream end portion of the second pipe block. Therefore, the treatment liquid before the electrolytic regeneration, that is, the treatment liquid with a high concentration of manganate, can be caused to flow into the first pipe block and the second pipe block. As a result, the efficiency of electrolytic regeneration can be increased by comparison with that attained with the configuration in which a single flow channel is formed by connecting the first pipe block and the second pipe block in series.

Further, when the regeneration unit is constructed by preparing in advance a plurality of pipe blocks in which the upstream pipe and the downstream pipe are connected in series, the first pipe block and the second pipe block may be connected in parallel as mentioned hereinabove and therefore operability can be improved.

Further, with the above-described configuration, when a feed pump is provided, the treatment liquid can be caused to flow into the first pipe block and the second pipe block by providing only one pump in the feed-side conduit or return-side conduit. When a filter is provided, the treatment liquid passing through the first pipe block and the second pipe block can be filtered by providing only one filter in the return-side conduit. Therefore, the number of components can be reduced.

Further, in the third embodiment, the downstream first pipe is provided to be tilted with respect to the upstream first pipe, so that the extension direction of the downstream first pipe forms an acute angle with the extension direction of the upstream first pipe, and the downstream second pipe is provided to be tilted with respect to the upstream second pipe, so that the extension direction of the downstream second pipe forms an acute angle with the extension direction of the upstream second pipe.

With such a configuration, in the first pipe block, the downstream first pipe is provided to be tilted, as described hereinabove, with respect to the upstream first pipe, and in the second pipe block, the downstream second pipe is provided to be tilted, as described hereinabove, with respect to the upstream second pipe. Thus, in the first pipe block, the two pipes are disposed in a V-like form, and in the second pipe block, the two pipes are disposed in a V-like form. Therefore, the length of the pipes in the extension direction can be reduced and the device can be reduced in size, while maintaining about the same efficiency of electrolytic regeneration, by comparison with the case in which a linear flow channel with a length equal to a sum total of the lengths of two pipes is formed by a single pipe.

Further, in the third embodiment, the electrolytic regeneration device further includes a first valve capable of restricting the inflow of the treatment liquid into the first pipe block and a second valve capable of restricting the inflow of the treatment liquid into the second pipe block.

With such a configuration, when, for example, maintenance of the first pipe block is performed, maintenance of the pipes and cathodes of the first pipe block can be performed by closing the first valve and restricting the inflow of the treatment liquid into the first pipe block. Further, during the maintenance of the first pipe block, since the inflow of the treatment liquid into the first pipe block is restricted, the second pipe block can be used for the electrolytic regeneration.

Further, in the seventh embodiment, the tubular portion has an opening at one end in the extension direction thereof, the other end of the tubular portion in the extension direction is closed, and the cathode includes a base portion attached to the one end of the tubular portion, and a protruding portion inserted from the opening into the tubular portion and extending from the base portion along the extension direction of the tubular portion.

With such a configuration, the opening is provided at one end of the tubular portion and the other end thereof is closed. Therefore, when the cathode is attached to the tubular portion, the protruding portion of the cathode is inserted from the opening of the tubular portion into the tubular portion, and the base portion of the cathode is attached to the one end of the tubular portion, thereby making it possible to position the protruding portion at the desired position inside the tubular portion. Thus, the cathode attachment operation may be performed only at one end of the tubular portion and therefore the operation of attaching the cathode to the tubular portion and the cathode replacement operation are facilitated by comparison with those performed when the openings are provided at both ends of the tubular portion. Further, since the attachment portion of the cathode to the tubular portion is only at one end of the tubular portion, the possibility of leak from the attachment portion can be further reduced by comparison with the case in which openings are provided at both ends of the tubular portion and the portions for attaching the cathode to the tubular portion are located at both ends.

In the fifth embodiment, the regeneration unit further includes the auxiliary anode disposed inside the tubular portion and electrically connected to the tubular portion, and the auxiliary anode is disposed opposite the cathode in a state of separation from the cathode.

With such a configuration, since the regeneration unit further includes the auxiliary anode, the anode surface area is increased by comparison with the case in which region functioning as the anode is only the inner circumferential surface of the tubular portion. As a result, the quantity of electricity conducted to the regeneration unit can be increased and therefore the capacity of electrolytic regeneration can be increased.

Further, in the fifth embodiment, the auxiliary anode has a tubular shape extending along the cathode so as to surround the circumference of the cathode, and has a plurality of through holes.

With such a configuration, since the auxiliary anode has a plurality of through holes, even when the auxiliary anode is disposed inside the tubular portion so as to surround the circumference of the cathode, the treatment liquid will pass through the plurality of through holes and reach the inner circumferential surface of the tubular portion. Therefore, the internal circumferential surface of the tubular portion functions naturally as the anode. Further, since the auxiliary anode has a tubular shape extending along the cathode so as to surround the cathode circumference, the surface area of the anode can be effectively increased around the cathode.

In the seventh embodiment, the electrolytic regeneration device further includes an insulating member that is attached to the cathode and extends from the cathode toward the inner circumferential surface of the tubular portion, so as to prevent contact between the cathode and the inner circumferential surface of the tubular portion.

With such a configuration, since the insulating member is attached to the cathode, for example, even when the cathode undergoes bending deformation and the cathode moves in the direction of approaching the inner circumferential surface of the tubular portion, the insulating member comes into contact with the inner circumferential surface of the tubular portion before the cathode comes into contact with the inner circumferential surface of the tubular portion. As a result, contact between the cathode and the inner circumferential surface of the tubular portion can be prevented.

In the fourth embodiment, the electrolytic regeneration device further includes a temperature adjusting unit for adjusting the temperature of the tubular portion.

With such a configuration, even when heat is generated in the regeneration unit during electrolytic regeneration, the increase in temperature of the treatment liquid can be suppressed. Therefore, such flaws as the decrease in quality of the treatment liquid induced by the increase in temperature of the treatment liquid can be suppressed and flaws of the device caused by the increase in temperature of the treatment liquid can be suppressed. Further, when the temperature adjusting unit includes not only cooling means for cooling the tubular portion, but also heating means, the temperature of the treatment liquid can be controlled with better accuracy.

In the sixth embodiment, the electrolytic regeneration device further includes a gas discharge valve for discharging gas generated in the regeneration unit.

With such a configuration, gas generated by electrolysis of the treatment liquid in the regeneration unit can be discharged to the outside of the device through the gas discharge valve.

Other Embodiments

The electrolytic regeneration device of the embodiments of the present invention are described above, but the present invention is not limited to the aforementioned embodiments and a variety of changes and modifications can be made without departing from the essence of the invention. For example, in the aforementioned embodiments, the case is described by way of example in which a permanganate solution is used as the treatment liquid, but the present invention is not limited to such treatment liquid.

Further, in the aforementioned embodiments, the case is described by way of example in which a round columnar pipe is used as the tubular portion in the regeneration unit, but such as configuration is not limiting, and the tubular portion may have, for example, an angular columnar shape, a conical shape, an truncated pyramidal shape, a barrel-like shape, and a U-like tubular shape.

Further, in the aforementioned embodiments, the case is described by way of example in which the regeneration unit has three pipes, namely, the first pipe, the second pipe, and the third pipe, but the number of pipes may be 1 or 2 and also equal to or greater than 4.

Further, in the aforementioned second embodiment, the case is described by way of example in which a single feed-side conduit connected to the desmearing treatment tank is branched in the intermediate section thereof and the branches are connected to each pipe, but such a configuration is not limiting. For example, a plurality of feed-side conduits may be connected to the desmearing treatment tank and each feed-side conduit may be connected to the corresponding pipe. More specifically, for example, a configuration may be used in which three feed-side conduits 15 are connected to the side surface of the desmearing treatment tank 13, the downstream end portion 15b of one feed-side conduit 15 from among the three feed-side conduits is connected to the upstream end portion of the first pipe 231, the downstream end portion 15b of the other feed-side conduit 15 is connected to the upstream end portion of the second pipe 232, and the downstream end portion 15b of the remaining one feed-side conduit 15 is connected to the upstream end portion of the third pipe 233. In this case, three return-side conduits 17 may be similarly provided.

In the aforementioned fifth embodiment, the case is described by way of example in which the auxiliary anode 81 has a tubular shape such as to cover the entire circumference of the extending portion 28 of the cathode 25, but such a configuration is not limiting. The auxiliary anode 81 may be arranged opposite only a portion of the extending portion 28, rather than so as to cover the entire circumference of the extending portion 28 of the cathode 25. Further, the case is described by way of example in which the auxiliary anode 81 is in contract with the inner circumferential surface 31 of the pipe, but such a configuration is not limiting. Thus, the auxiliary anode 81 is not necessarily in contract, provided that another means for electrically connecting the auxiliary anode 81 to the inner circumferential surface 31 of the pipe is provided. For example, the auxiliary anode may be disposed close to the inner circumferential surface 31 of the pipe or in the vicinity of the center of the inner circumferential surface 31 of the pipe and the cathode 25.

Further, in the aforementioned fifth embodiment, the case is described by way of example in which the auxiliary anode is provided to increase the surface area of the anode, but the surface area of the anode can be also increased, for example, by providing a plurality of concavities and convexities on the inner circumferential surface of the anode pipe. Further, an auxiliary anode having a plurality of concavities and convexities on the surface may be also used.

Further, in the aforementioned seventh embodiment, the cathode 25 in which the base portion 26, the extending portion 28, and the wiring connection portion 24 are formed integrally is described by way of example, but such a configuration is not limiting. For example, the base portion 26 and the extending portion 28 may be formed separately. Further, when the base portion 26 is formed from an insulating material, the above-mentioned insulating packing 99 can be omitted.

The present invention is described below in greater detail on the basis of examples thereof, but the present invention is not limited to the below-described examples.

Examples

Electrolytic regeneration was performed under the conditions shown in Examples 1 to 15 and Comparative Examples 1 and 2 in Tables 1 to 3. The following solution was used as the aqueous solution in the electrolytic regeneration. The tests were conducted at a temperature of the aqueous solution of 75° C.

Composition of Aqueous Solution
  Sodium permanganate: 25 g/L
  Sodium manganate: 15 g/L
  Sodium hydroxide: 80 g/L The electrolytic regeneration tank 11 shown in FIGS. 1 and 2 was used for electrolytic regeneration performed in Examples 1 to 15.

A device in which the aqueous solution was stored in the electrolytic regeneration tank such as shown in FIG. 1 of Japanese Patent No. 3301341 and the anode and cathode were immersed into the aqueous solution that was used for electrolytic regeneration performed in Comparative Examples 1 and 2. In Comparative Examples 1 and 2, the feed-side conduit that supplies the aqueous solution to the electrolytic regeneration tank is connected to one side surface of the electrolytic regeneration tank, and the return-side conduit that returns the aqueous solution discharged from the electrolytic regeneration tank to the desmearing treatment tank is connected to a side surface that is opposite to the one side surface.

The volume of liquid in the electrolytic regeneration device that is presented in the tables means the volume of aqueous solution present in the regeneration unit 19, feed-side conduit 15, and return-side conduit 17 in Examples 1 to 15 and means the volume of aqueous solution present in the electrolytic regeneration tank, feed-side conduit, and return-side conduit in Comparative Examples 1 and 2.

The electrode pair (a) in the tables means the inner circumferential surface (anode) 31 of the first pipe 231 shown in FIG. 2 and the cathode 25 provided inside the first pipe 231, the electrode pair (b) means the inner circumferential surface (anode) 31 of the second pipe 232 and the cathode 25 provided inside the second pipe 232, and the electrode pair (c) means the inner circumferential surface (anode) 31 of the third pipe 233 and the cathode 25 provided inside the third pipe 233.

The flow velocity through the electrodes in the tables is the distance (mm/sec) traveled by the aqueous solution in 1 sec in the vicinity of the cathode and anode. The flow velocity through the electrodes is calculated in the following manner. Where the cross-sectional surface area of the flow channel through which the aqueous solution passes in the regeneration unit is denoted by A (mm$^2$) and the pump flow rate is denoted by B (mL/sec), the flow velocity through the electrodes can be represented by the following formula:

$$\text{Flow velocity through the electrodes (mm/sec)} = B \times 1000/A.$$

In Examples 1 to 15, the cross-sectional surface area A of the flow channel is a surface area of the gap between the pipe 23 and the cathode 25 in a cross section perpendicular to the longitudinal direction of the pipe 23. In Comparative Examples 1 and 2, the surface area of the aqueous solution in a cross section parallel to the aforementioned one side surface of the electrolytic regeneration tank to which the feed-side conduit is connected was taken as the cross-sectional surface area A of the flow channel.

The sodium permanganate regeneration ratio (g/AH) in the tables is a value obtained by dividing the regenerated amount per 1 hour of treatment time by the current quantity used (A). The sodium permanganate regeneration amount (g) represents the regenerated amount per 1 hour of treatment time. The sodium permanganate regeneration amount (g/L) is a value obtained by further dividing the regenerated amount per 1 hour of treatment time by the total volume of liquid.

The amount of sludge in the tables is the amount of sludge remaining in the regeneration unit 19 after 5 hours of treatment.

TABLE 1

|  |  | Examples | | | | | | |
|---|---|---|---|---|---|---|---|---|
|  |  | 1 | 2 | 3 | 4 | 5 | 6 | 7 |
| Volume of liquid in desmearing tank (L) | | 100 | 100 | 100 | 100 | 100 | 100 | 100 |
| Volume of liquid in electrolytic regeneration tank (L) (including feed-side conduit and return-side conduit) | | 10 | 10 | 10 | 10 | 10 | 10 | 10 |
| Total volume of liquid (L) | | 110 | 110 | 110 | 110 | 110 | 110 | 110 |
| Surface area ratio (cathode: anode) | Electrode pair (a) | 1:20 | 1:20 | 1:20 | 1:10 | 1:60 | 1:20 | 1:20 |
|  | Electrode pair (b) | 1:20 | 1:20 | 1:20 | 1:10 | 1:60 | 1:20 | 1:20 |
|  | Electrode pair (c) | 1:20 | 1:20 | 1:20 | 1:10 | 1:60 | 1:20 | 1:20 |
| Anode current density (A/dm$^2$) | Electrode pair (a) | 5.0 | 5.0 | 5.0 | 5.0 | 5.0 | 10.0 | 30.0 |
|  | Electrode pair (b) | 5.0 | 5.0 | 5.0 | 5.0 | 5.0 | 10.0 | 30.0 |
|  | Electrode pair (c) | 5.0 | 5.0 | 5.0 | 5.0 | 5.0 | 10.0 | 30.0 |
| Flow velocity through electrodes (mm/sec) | Electrode pair (a) | 5 | 25 | 100 | 25 | 25 | 25 | 25 |
|  | Electrode pair (b) | 5 | 25 | 100 | 25 | 25 | 25 | 25 |
|  | Electrode pair (c) | 5 | 25 | 100 | 25 | 25 | 25 | 25 |
| Current quantity used (A) | | 120 | 120 | 120 | 120 | 120 | 240 | 720 |
| Total anode surface area (dm$^2$) | | 24 | 24 | 24 | 24 | 24 | 24 | 24 |
| 1) Sodium permanganate regeneration ratio (g/AH) | | 2.55 | 2.45 | 1.95 | 2.02 | 2.25 | 2.37 | 1.21 |
| 2) Sodium permanganate regeneration amount (g) (treatment time: 1 h) | | 306.0 | 294.0 | 234.0 | 242.4 | 270.0 | 568.8 | 871.2 |

TABLE 1-continued

|  | Examples | | | | | | |
| --- | --- | --- | --- | --- | --- | --- | --- |
|  | 1 | 2 | 3 | 4 | 5 | 6 | 7 |
| 3) Sodium permanganate regeneration amount (g/L) (amount of 2) (g) divided by total liquid amount (L)) | 2.78 | 2.67 | 2.13 | 2.20 | 2.45 | 5.17 | 7.92 |
| 4) Amount of sludge (g) (treatment time: 5 h) | 1.0 | 0.03 | 0.001 | 0.03 | 0.03 | 0.03 | 0.03 |

TABLE 2

|  |  | Examples | | | |
| --- | --- | --- | --- | --- | --- |
|  |  | 8 | 9 | 10 | 11 |
| Volume of liquid in desmearing tank (L) | | 100 | 100 | 100 | 100 |
| Volume of liquid in electrolytic regeneration tank (L) (including feed-side conduit and return-side conduit) | | 10 | 10 | 10 | 10 |
| Total volume of liquid (L) | | 110 | 110 | 110 | 110 |
| Surface area ratio (cathode:anode) | Electrode pair (a) | 1:10 | 1:20 | 1:20 | 1:10 |
| | Electrode pair (b) | 1:20 | 1:20 | 1:20 | 1:20 |
| | Electrode pair (c) | 1:60 | 1:20 | 1:20 | 1:60 |
| Anode current density (A/dm$^2$) | Electrode pair (a) | 5.0 | 5.0 | 5.0 | 5.0 |
| | Electrode pair (b) | 5.0 | 10.0 | 5.0 | 10.0 |
| | Electrode pair (c) | 5.0 | 20.0 | 5.0 | 20.0 |
| Flow velocity through electrodes (mm/sec) | Electrode pair (a) | 25 | 25 | 30 | 30 |
| | Electrode pair (b) | 25 | 25 | 20 | 20 |
| | Electrode pair (c) | 25 | 25 | 10 | 10 |
| Current quantity used (A) | | 120 | 280 | 120 | 280 |
| Total anode surface area (dm$^2$) | | 24 | 24 | 24 | 24 |
| 1) Sodium permanganate regeneration ratio (g/AH) | | 2.38 | 2.46 | 2.42 | 2.44 |
| 2) Sodium permanganate regeneration amount (g) (treatment time: 1 h) | | 285.6 | 688.8 | 290.4 | 683.2 |
| 3) Sodium permanganate regeneration amount (g/L) (amount (g) of 2) divided by total liquid amount (L)) | | 2.60 | 6.26 | 2.64 | 6.21 |
| 4) Amount of sludge (g) (treatment time: 5 h) | | 0.03 | 0.03 | 0.03 | 0.03 |

TABLE 3

|  |  | Examples | | | | Comparative Examples | |
| --- | --- | --- | --- | --- | --- | --- | --- |
|  |  | 12 | 13 | 14 | 15 | 1 | 2 |
| Volume of liquid in desmearing tank (L) | | 100 | 100 | 100 | 100 | 100 | 100 |
| Volume of liquid in electrolytic regeneration tank (L) (including feed-side conduit and return-side conduit) | | 10 | 10 | 10 | 10 | 150 | 150 |
| Total volume of liquid (L) | | 110 | 110 | 110 | 110 | 250 | 250 |
| Surface area ratio (cathode:anode) | Electrode pair (a) | 1:20 | 1:20 | 1:1 | 1:20 | 1:20 | 1:20 |
| | Electrode pair (b) | 1:20 | 1:20 | 1:1 | 1:20 | | |
| | Electrode pair (c) | 1:20 | 1:20 | 1:1 | 1:20 | | |
| Anode current density (A/dm$^2$) | Electrode pair (a) | 0.5 | 5.0 | 5.0 | 5.0 | 5.0 | 30.0 |
| | Electrode pair (b) | 0.5 | 5.0 | 5.0 | 5.0 | | |
| | Electrode pair (c) | 0.5 | 5.0 | 5.0 | 5.0 | | |
| Flow velocity through electrodes (mm/sec) | Electrode pair (a) | 25 | 300 | 25 | 1 | 2 | 2 |
| | Electrode pair (b) | 25 | 300 | 25 | 1 | | |
| | Electrode pair (c) | 25 | 300 | 25 | 1 | | |
| Current quantity used (A) | | 12 | 120 | 120 | 120 | 120 | 720 |
| Total anode surface area (dm$^2$) | | 24 | 24 | 24 | 24 | 24 | 24 |
| 1) Sodium permanganate regeneration ratio (g/AH) | | 1.99 | 1.37 | 1.85 | 2.64 | 2.42 | 0.78 |
| 2) Sodium permanganate regeneration amount (g) (treatment time: 1 h) | | 23.9 | 164.4 | 222.0 | 316.8 | 290.4 | 561.6 |
| 3) Sodium permanganate regeneration amount (g/L) (amount (g) of 2) divided by total liquid amount (L)) | | 0.22 | 1.49 | 2.02 | 2.88 | 1.16 | 2.25 |
| 4) Amount of sludge (g) (treatment time: 5 h) | | 0.03 | 0.001 | 0.03 | 2.6 | 3.2 | 3.2 |

The results of the tests are shown in Tables 1 to 3.

In Examples 1 to 15 in which the regeneration unit 19 is configured such that the aqueous solution is caused to flow directly into the pipe 231, the cross-sectional area A of the flow channel through which the aqueous solution flows in the regeneration unit 19 is small. Therefore, by changing the flow rate of the pump 41, it is possible to adjust the flow velocity through the electrodes, for example, within a wide rage of 1 mm/sec to 300 mm/sec, as shown in Tables 1 to 3.

In the case of configuration in which the cathode and anode are immersed in the electrolytic regeneration tank, as in Comparative Examples 1 and 2, the cross-sectional surface area A of the flow channel increases. Therefore, it is difficult to adjust the flow velocity through the electrodes within a wide range as in the examples. Therefore, in the case of the configuration such as that of Comparative Examples 1 and 2, it is difficult to increase the flow velocity through the electrodes that is equal to or greater than 5 mm/sec or equal to or greater than 25 mm/sec.

As shown in Table 3, in Comparative Examples 1 and 2, the regeneration unit is configured by the electrolytic regeneration tank storing the aqueous solution and the cathode and anode immersed in the aqueous solution. Therefore, the volume of liquid in the regeneration unit is 1.5 times that in the desmearing treatment tank. By contrast, in the configuration of Examples 1 to 15, the aqueous solution is caused to flow directly into the pipe 231 of the regeneration unit 19. Therefore, the volume of liquid in the regeneration unit 19 is 1/10 that in the desmearing treatment tank.

In Example 1, the amount of sludge is 1.0 g, whereas in Comparative Examples 1 and 2, the amount of sludge is as large as 3.2 g. This is because in Example 1, the flow velocity through the electrodes is 5 mm/sec, whereas, in Comparative Examples 1 and 2, the flow velocity through the electrodes is as low as 2 mm/sec and therefore the sludge can easily accumulate on the cathode.

Further, in Examples 2 to 14, the flow velocity through the electrodes is set to a large value that is equal to or greater than 25 mm and therefore the sludge amount is reduced to an even smaller value. In particular, when the flow velocity through the electrodes is equal to or greater than 100 mm/sec, practically no sludge is accumulated on the cathode.

Further, in Example 13, the sodium permanganate regeneration efficiency is somewhat decreased because the flow velocity through the electrodes has been set to a large value of 300 mm/sec.

In Example 15, the flow velocity through the electrodes is 1 mm/sec which is less than the flow velocity through the electrodes in Comparative Examples 1 and 2, but even in this case the amount of sludge is 2.6 g and less than 3.2 in Comparative Examples 1 and 2. This is supposedly because in Example 15, the aqueous solution flows along the longitudinal direction of the cathode 25 in the regeneration unit 19, whereas in Comparative Examples 1 and 2, the aqueous solution flows in the direction substantially perpendicular to the longitudinal direction of the cathode in the electrolytic regeneration tank.

In Comparative Example 2, the anode current density is set to a large value of 30 A/dm$^2$. Where the anode current density is thus increased, the sodium permanganate regeneration ratio tends to decrease. In Example 7, the anode current density is set to the same value (30 A/dm$^2$) as in Comparative Example 2. In Example 7, the sodium permanganate regeneration ratio is less (1.21 g/AH) than in other examples, but the decrease in the sodium permanganate regeneration ratio is suppressed by comparison with that in Comparative Example 2. This is why it can be said that in Example 7, the efficiency of sodium permanganate regeneration is superior to that in Comparative Example 2.

Further, since the electrolytic regeneration tank is used in Comparative Examples 1 and 2, the total volume of liquid increases. Therefore, the sodium permanganate regeneration amount (g/L) decreases and the efficiency is poor.

The above-described embodiments can be summarized as follows.

(1) The electrolytic regeneration device of the aforementioned embodiments serves for electrolyzing and regenerating a treatment liquid used in a desmearing treatment in a desmearing treatment tank. The electrolytic regeneration device includes a regeneration unit, a feed-side conduit, and a return-side conduit. The regeneration unit includes a tubular portion having an inner circumferential surface functioning as an anode and a cathode provided inside the tubular portion and extending along an extension direction of the tubular portion in a state of separation from the inner circumferential surface. In the regeneration unit, the treatment liquid is fed through a gap between the inner circumferential surface of the tubular portion and the cathode. The feed-side conduit is connected by a downstream end portion thereof to the tubular portion and guides the treatment liquid discharged from the desmearing treatment tank into the regeneration unit. The return-side conduit is connected by an upstream end portion thereof to the tubular portion and guides the treatment liquid discharged from the regeneration unit into the desmearing treatment tank.

In such a configuration, the downstream end portion of the feed-side conduit is connected to the tubular portion of the regeneration unit. Therefore, the liquid discharged from the desmearing treatment tank flows directly into the tubular portion through the feed-side conduit. The treatment liquid that has flown into the tubular portion is electrolyzed and regenerated, while being fed through the gap between the inner circumferential surface of the tubular portion and the cathode. The treatment liquid that has been regenerated and discharged from the regeneration unit is guided to the desmearing treatment tank through the return-side conduit.

In such a configuration, by contrast with the conventional configuration in which the treatment liquid is stored in the electrolytic regeneration tank and the cathode and anode are immersed into the treatment liquid, the treatment liquid discharged from the desmearing treatment tank is caused to flow directly into the tubular portion through the feed-side conduit. Further, the treatment liquid that has been electrolyzed in the regeneration unit is caused to flow out directly into the return-side conduit connected to the tubular portion and fed to the desmearing treatment tank. Thus, with such a configuration, the tubular portion functions as an anode and also functions as a flow channel that is interposed between the feed-side conduit and return-side conduit and allows the treatment liquid to flow between the anode and cathode. Therefore, with such a configuration, the electrolytic regeneration tank such as used in the conventional configuration is unnecessary and therefore, the electrolytic regeneration device can be reduced in size and the bath volume can be decreased.

(2) In the aforementioned electrolytic regeneration device, it is preferred that the tubular portion include a first pipe having an inner circumferential surface functioning as an anode and a second pipe having an inner circumferential surface functioning as an anode, and the cathode include a first cathode that is provided inside the first pipe and extends along an extension direction of the first pipe in a state of separation from the inner circumferential surface of the first pipe, and a second cathode that is provided inside the second pipe and extends along an extension direction of the second pipe in a state of separation from the inner circumferential surface of the second pipe. In this case, it is preferred that the second pipe be juxtaposed with the first pipe, such that the extension direction of the second pipe is parallel to the extension direction of the first pipe and the second pipe is adjacent to the first pipe in a width direction, the downstream end portion of the feed-side conduit be connected to one end portion of the first pipe, and the other end portion of the first pipe communicate with one end portion of the second pipe.

With such a configuration, since the end portions of the first pipe and second pipe communicate with one another, the first pipe and second pipe form a single flow channel through which the treatment liquid flows. In the aforementioned single flow channel, one end portion of the first pipe connected to the downstream end portion of the feed-side conduit serves as an inlet port for the treatment liquid and the treatment liquid flows through the other end portion of the first pipe, one end portion of the second pipe, and the other end portion of the second pipe in the order of description. Further, the second pipe is juxtaposed with the first pipe so as to be parallel thereto. Therefore, with such a configuration, the length of the pipes in the extension direction can be reduced, while maintaining about the same efficiency of electrolytic regeneration, by comparison with the case in which a linear flow channel with a length equal to a sum total of the flow channel length of the first pipe and the flow channel length of the second pipe is formed by a single pipe.

(3) In the case in which the first pipe and the second pipe form the aforementioned single flow channel, it is preferred that the second pipe be disposed higher than the first pipe.

With such a configuration, since the second pipe located on the downstream side is disposed above the first pipe located on the upstream side, the gas generated by electrolysis of the treatment liquid in the regeneration unit can rise inside the regeneration unit, while moving along the flow of the treatment liquid, without flowing counter to the flow direction of the treatment liquid. As a result, the gas generated by electrolysis moves smoothly to the downstream side of the regeneration unit along the flow of the treatment liquid and is therefore prevented from being retained inside the regeneration unit.

(4) In the aforementioned electrolytic regeneration device, it is preferred that the tubular portion include a first pipe having an inner circumferential surface functioning as an anode and a second pipe having an inner circumferential surface functioning as an anode; and the cathode include a first cathode that is provided inside the first pipe and extends along an extension direction of the first pipe in a state of separation from the inner circumferential surface of the first pipe, and a second cathode that is provided inside the second pipe and extends along an extension direction of the second pipe in a state of separation from the inner circumferential surface of the second pipe. In this case, it is preferred that the downstream end portion of the feed-side conduit be connected to an upstream end portion of the first pipe; a downstream end portion of the first pipe be connected to an upstream end portion of the second pipe; and the second pipe be disposed to be tilted with respect to the first pipe, so that the extension direction of the second pipe forms an acute angle with the extension direction of the first pipe.

With such a configuration, since the downstream end portion of the first pipe is connected to the upstream end portion of the second pipe, the first pipe and second pipe form a single flow channel through which the treatment liquid flows. Thus, in the aforementioned single flow channel, the upstream end portion of the first pipe connected to the downstream end portion of the feed-side conduit serves as an inlet port for the treatment liquid and the treatment liquid flows through the downstream end portion of the first pipe, the upstream end portion of the second pipe, and the downstream end portion of the second pipe in the order of description. Further, the second pipe is provided to be tilted with respect to the first pipe, so that the extension direction of the second pipe forms an acute angle with the extension direction of the first pipe. Therefore, with such a configuration, the length of the pipes in the extension direction can be reduced, while maintaining about the same efficiency of electrolytic regeneration, by comparison with the case in which a linear flow channel with a length equal to a sum total of the flow channel length of the first pipe and the flow channel length of the second pipe is formed by a single pipe.

(5) When the second pipe is provided to be tilted with respect to the first pipe, it is preferred that the second pipe be disposed higher than the first pipe, the first pipe be tilted with respect to the horizontal direction so that the downstream end portion thereof is higher than the upstream end portion thereof, and the second pipe be tilted with respect to the horizontal direction so that the downstream end portion thereof is higher than the upstream end portion thereof.

With such a configuration, since the second pipe located on the downstream side is disposed above the first pipe located on the upstream side, the gas generated by electrolysis of the treatment liquid in the regeneration unit can rise inside the regeneration unit, while moving along the flow of the treatment liquid, without flowing counter to the flow direction of the treatment liquid. As a result, the gas generated by electrolysis moves smoothly to the downstream side of the regeneration unit along the flow of the treatment liquid and is therefore prevented from being retained inside the regeneration unit. Furthermore, in the above-described configuration, since the pipes are tilted with respect to the horizontal direction as described hereinabove, the gas can move even smoother inside the pipes toward the downstream side.

(6) In the aforementioned electrolytic regeneration device, it is preferred that the tubular portion include a first pipe having an inner circumferential surface functioning as an anode and a second pipe having an inner circumferential surface functioning as an anode, and the cathode include a first cathode that is provided inside the first pipe and extends along an extension direction of the first pipe in a state of separation from the inner circumferential surface of the first pipe, and a second cathode that is provided inside the second pipe and extends along an extension direction of the second pipe in a state of separation from the inner circumferential surface of the second pipe. In this case, it is preferred that the treatment liquid flowing in the feed-side conduit be guided to one end of the first pipe in the extension direction thereof and to one end of the second pipe in the extension direction thereof and discharged to the return-side conduit from the other end of the first pipe in the extension direction thereof and the other end of the second pipe in the extension direction thereof.

With such a configuration, the efficiency of electrolytic regeneration can be increased over that attained with the above-described configuration in which tubular first pipe and second pipe form a single flow channel. The reason therefor is explained below with reference to the exemplary case in which the treatment liquid is an aqueous solution of a permanganate.

In the treatment liquid used for the desmearing treatment in the desmearing treatment tank, part of the permanganate is reduced to a manganate. The treatment liquid that has been discharged from the desmearing treatment tank and fed into the regeneration unit via the feed-side conduit is electrolyzed in the process of flowing from the upstream side to the downstream side of the tubular portion. As a result, the manganate contained in the treatment liquid is oxidized and becomes a permanganate. Therefore, the concentration of the manganate in the downstream side of the tubular portion becomes lower than the concentration of manganate in the upstream side of the tubular portion. As a result the efficiency of electrolytic regeneration on the downstream side of the tubular portion decreases with respect to the efficiency of the electrolytic regeneration on the upstream side of the tubular portion.

With such a configuration the treatment liquid flowing in the feed-side conduit is guided to one end portion in the extension direction in the first pipe and one end portion in the extension direction in the second pipe. Therefore, the treatment liquid prior to the electrolytic regeneration, which has a high concentration of manganate, can be caused to flow into the first pipe and second pipe. Therefore, the efficiency of electrolytic regeneration can be increased over that attained in the above-described configuration in which the first pipe and second pipe form the single flow channel.

(7) In the above-described electrolytic regeneration device, it is preferred that the tubular portion include a first pipe block in which an upstream first pipe having an inner circumferential surface functioning as an anode and a downstream first pipe having an inner circumferential surface functioning as an anode are connected in series, and a second pipe block in which an upstream second pipe having an inner circumferential surface functioning as an anode and a downstream second pipe having an inner circumferential surface functioning as an anode are connected in series; and that the cathode include an upstream first cathode provided inside the upstream first pipe and extending along an extension direction of the upstream first pipe in a state of separation from the inner circumferential surface of the upstream first pipe; a downstream first cathode provided inside the downstream first pipe and extending along an extension direction of the downstream first pipe in a state of separation from the inner circumferential surface of the downstream first pipe; an upstream second cathode provided inside the upstream second pipe and extending along an extension direction of the upstream second pipe in a state of separation from the inner circumferential surface of the upstream second pipe; and a downstream second cathode provided inside the downstream second pipe and extending along an extension direction of the downstream second pipe in a state of separation from the inner circumferential surface of the downstream second pipe. In this case, it is preferred that the first pipe block and the second pipe block are juxtaposed with each other such that the treatment liquid flowing in the feed-side conduit is guided to an upstream end portion of the first pipe block and to an upstream end portion of the second pipe block and the treatment liquid is discharged into the return-side conduit from a downstream end portion of the first pipe block and a downstream end portion of the second pipe block.

With such a configuration, the pipe blocks are used in which the flow channel length is increased and electrolytic regeneration capacity is improved over those attained in the case in which a single pipe is used (only the upstream pipe or only the downstream pipe) because the upstream pipe and the downstream pipe are connected in series. Further, a regeneration unit can be constructed by using the number of the aforementioned pipe blocks that corresponds to the necessary electrolytic regeneration capacity. In this case, the first pipe block and the second pipe block are connected in parallel so that the treatment liquid flowing in the feed-side conduit is guided to the upstream end portion of the first pipe block and the upstream end portion of the second pipe block. Therefore, the treatment liquid before the electrolytic regeneration, that is, the treatment liquid with a high concentration of manganate, can be caused to flow into the first pipe block and the second pipe block. As a result, the efficiency of electrolytic regeneration can be increased by comparison with that attained with the configuration in which a single flow channel is formed by connecting the first pipe block and the second pipe block in series.

Further, when the regeneration unit is constructed by preparing in advance a plurality of pipe blocks in which the upstream pipe and the downstream pipe are connected in series, the first pipe block and the second pipe may be connected in parallel as mentioned hereinabove and therefore operability can be improved.

Further, with the above-described configuration, when a feed pump is provided, the treatment liquid can be caused to flow into the first pipe block and the second pipe block by providing only one pump in the feed-side conduit or return-side conduit. When a filter is provided, the treatment liquid passing through the first pipe block and the second pipe block can be filtered by providing only one filter in the return-side conduit. Therefore, the number of components can be reduced.

(8) When the tubular portion includes the first pipe block and the second pipe block, it is preferred that the downstream first pipe be juxtaposed with the upstream first pipe, such that the extension direction of the downstream first pipe is parallel to the extension direction of the upstream first pipe and the downstream first pipe is adjacent to the upstream first pipe in a width direction; and the downstream second pipe be juxtaposed with the upstream second pipe, such that the extension direction of the downstream second pipe is parallel to the extension direction of the upstream second pipe and the downstream second pipe is adjacent to the upstream second pipe in the width direction.

With such a configuration, in the first pipe block, the downstream first pipe is juxtaposed with the upstream first pipe and parallel thereto, and in the second pipe block, the downstream second pipe is juxtaposed with the upstream second pipe and parallel thereto. Thus, in the first pipe block, the two pipes are disposed in a U-like form, and in the second pipe block, the two pipes are disposed in a U-like form. Therefore, the length of the pipes in the extension direction can be reduced, while maintaining about the same efficiency of electrolytic regeneration, by comparison with the case in which a linear flow channel with a length equal to a sum total of the lengths of two pipes is formed by a single pipe.

(9) When the tubular portion includes the first pipe block and the second pipe block, it is preferred that the downstream first pipe be disposed to be tilted with respect to the upstream first pipe, so that the extension direction of the downstream first pipe forms an acute angle with the extension direction of the upstream first pipe; and the downstream second pipe be disposed to be tilted with respect to the upstream second pipe, so that the extension direction of the downstream second pipe forms an acute angle with the extension direction of the upstream second pipe.

With such a configuration, in the first pipe block, the downstream first pipe is provided to be tilted, as described hereinabove, with respect to the upstream first pipe, and in the second pipe block, the downstream second pipe is provided to be tilted, as described hereinabove, with respect to the upstream second pipe. Thus, in the first pipe block, the two pipes are disposed in a V-like form, and in the second pipe block, the two pipes are disposed in a V-like form. Therefore, the length of the pipes in the extension direction can be reduced, while maintaining about the same efficiency of electrolytic regeneration, by comparison with the case in which a linear flow channel with a length equal to a sum total of the lengths of two pipes is formed by a single pipe.

(10) The abovementioned electrolytic regeneration device preferably further includes: a first valve capable of restricting the inflow of the treatment liquid into the first pipe block; and a second valve capable of restricting the inflow of the treatment liquid into the second pipe block.

With such a configuration, when, for example, maintenance of the first pipe block is performed, maintenance of the pipes and cathodes of the first pipe block can be performed by closing the first valve and restricting the inflow of the treatment liquid into the first pipe block. Further, during the maintenance of the first pipe block, since the inflow of the treatment liquid into the first pipe block is restricted, the second pipe block can be used for the electrolytic regeneration.

(11) In the aforementioned electrolytic regeneration device, it is preferred that the tubular portion have openings at both ends in the extension direction thereof, and the regeneration unit further include a seal member that is provided close to each of the openings. In this case, it is preferred that the seal member be formed in a tubular shape having a through hole into which the cathode is inserted, interposed between the inner circumferential surface of the tubular portion and the cathode, and formed from an insulating material.

With such a configuration, by inserting the cathode into the through hole of the seal member provided close to the openings of the tubular portion, it is possible to support the cathode at the tubular portion in a state of insulation from the anode (inner circumferential surface of the tubular portion).

(12) In the aforementioned electrolytic regeneration device, it is preferred that the tubular portion have an opening at one end in the extension direction thereof, and the other end in the extension direction be closed; and that the cathode include a base portion attached to the one end of the tubular portion; and a protruding portion inserted from the opening into the tubular portion and extending from the base portion along the extension direction of the tubular portion.

With such a configuration, the opening is provided at one end of the tubular portion and the other end thereof is closed. Therefore, when the cathode is attached to the tubular portion, the protruding portion of the cathode is inserted from the opening of the tubular portion into the tubular portion, and the base portion of the cathode is attached to the one end of the tubular portion, thereby making it possible to position the protruding portion at the desired position inside the tubular portion. Thus, the cathode attachment operation may be performed only at one end of the tubular portion and therefore the operation of attaching the cathode to the tubular portion and the cathode replacement operation are facilitated by comparison with those performed when the openings are provided at both ends of the tubular portion. Further, since the attachment portion of the cathode to the tubular portion is only at one end of the tubular portion, the possibility of leak from the attachment portion can be further reduced by comparison with the case in which openings are provided at both ends of the tubular portion and the portions for attaching the cathode to the tubular portion are located at both ends.

(13) In the aforementioned electrolytic regeneration device, it is preferred that the regeneration unit further include an auxiliary anode disposed inside the tubular portion and electrically connected to the tubular portion, and the auxiliary anode be disposed opposite the cathode in a state of separation from the cathode.

With such a configuration, since the regeneration unit further includes the auxiliary anode, the anode surface area is increased by comparison with the case in which region functioning as the anode is only the inner circumferential surface of the tubular portion. As a result, the quantity of electricity conducted to the regeneration unit can be increased and therefore the capacity of electrolytic regeneration can be increased.

(14) In the aforementioned electrolytic regeneration device, it is preferred that the auxiliary anode have a tubular shape extending along the cathode so as to surround a circumference of the cathode and have a plurality of through holes.

With such a configuration, since the auxiliary anode has a plurality of through holes, even when the auxiliary anode is disposed inside the tubular portion so as to surround the circumference of the cathode, the treatment liquid will pass through the plurality of through holes and reach the inner circumferential surface of the tubular portion. Therefore, the internal circumferential surface of the tubular portion functions naturally as the anode. Further, since the auxiliary anode has a tubular shape extending along the cathode so as to surround the cathode circumference, the surface area of the anode can be effectively increased around the cathode.

(15) The above-mentioned electrolytic regeneration device preferably further includes an insulating member that is attached to the cathode and extending from the cathode toward the inner circumferential surface of the tubular portion, so as to prevent contact between the cathode and the inner circumferential surface of the tubular portion.

With such a configuration, since the insulating member is attached to the cathode, for example, even when the cathode undergoes bending deformation and the cathode moves in the direction of approaching the inner circumferential surface of the tubular portion, the insulating member comes into contact with the inner circumferential surface of the tubular portion before the cathode comes into contact with the inner circumferential surface of the tubular portion. As a result, contact between the cathode and the inner circumferential surface of the tubular portion can be prevented.

(16) The above-mentioned electrolytic regeneration device preferably further includes a temperature adjusting unit for adjusting a temperature of the tubular portion.

With such a configuration, since the temperature adjusting unit is provided, even when heat is generated in the regeneration unit during electrolytic regeneration, the increase in temperature of the treatment liquid can be suppressed. Therefore, such flaws as the decrease in quality of the treatment liquid induced by the increase in temperature of the treatment liquid can be suppressed and flaws of the device caused by the increase in temperature of the treatment liquid can be suppressed. Further, when the temperature adjusting unit includes not only cooling means for cooling the tubular portion, but also heating means, the temperature of the treatment liquid can be controlled with better accuracy.

(17) The above-mentioned electrolytic regeneration device preferably further includes a gas discharge valve for discharging gas generated in the regeneration unit.

With such a configuration, gas generated by electrolysis of the treatment liquid in the regeneration unit can be discharged to the outside of the device through the gas discharge valve.

This application is based on Japanese Patent application No. 2010-191127 filed in Japan Patent Office on Aug. 27, 2010 and Japanese Patent application No. 2011-132095 filed in Japan Patent Office on Jun. 14, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An electrolytic regeneration device for electrolyzing and regenerating a treatment liquid used in a desmearing treatment in a desmearing treatment tank, comprising:
a regeneration unit including a tubular portion having an inner circumferential surface functioning as a fixed anode and a fixed cathode provided inside the tubular portion and extending along an extension direction of the tubular portion in a state of separation from the inner circumferential surface, the treatment liquid being fed through a gap between the inner circumferential surface of the tubular portion and the cathode;
a feed-side conduit connected by a downstream end portion thereof to the tubular portion and guiding the treatment liquid discharged from the desmearing treatment tank into the regeneration unit; and
a return-side conduit connected by an upstream end portion thereof to the tubular portion and guiding the treatment liquid discharged from the regeneration unit into the desmearing treatment tank,
wherein
the tubular portion includes a first pipe having an inner circumferential surface functioning as an anode and a second pipe having an inner circumferential surface functioning as an anode;
the cathode includes a first cathode that is provided inside the first pipe and extends along an extension direction of the first pipe in a state of separation from the inner circumferential surface of the first pipe, and a second cathode that is provided inside the second pipe and extends along an extension direction of the second pipe in a state of separation from the inner circumferential surface of the second pipe;
the downstream end portion of the feed-side conduit is connected to one end portion of the first pipe, and the other end portion of the first pipe communicates with one end portion of the second pipe;
the second pipe is disposed above the first pipe;
the regeneration unit further includes a fixed auxiliary anode disposed inside the tubular portion and directly electrically connected to the tubular portion;
the auxiliary anode is disposed opposite the cathode in a state of separation from the cathode;
the auxiliary anode has a hollow cylindrical shape extending along the cathode so as to surround a circumference of the cathode, and has a plurality of through holes; and
the treatment liquid flows to the outer side of the auxiliary anode via the through holes.

2. The electrolytic regeneration device according to claim 1, wherein
the second pipe is juxtaposed with the first pipe, such that the extension direction of the second pipe is parallel to the extension direction of the first pipe and the second pipe is adjacent to the first pipe in a width direction.

3. The electrolytic regeneration device according to claim 1, wherein
the downstream end portion of the feed-side conduit is connected to an upstream end portion of the first pipe;
a downstream end portion of the first pipe is connected to an upstream end portion of the second pipe; and
the second pipe is disposed to be tilted with respect to the first pipe, so that the extension direction of the second pipe forms an acute angle with the extension direction of the first pipe.

4. The electrolytic regeneration device according to claim 3, wherein
the first pipe is tilted with respect to a horizontal direction so that the downstream end portion thereof is higher than the upstream end portion thereof; and
the second pipe is tilted with respect to a horizontal direction so that the downstream end portion thereof is higher than the upstream end portion thereof.

5. The electrolytic regeneration device according to claim 1, wherein
the treatment liquid flowing in the feed-side conduit is guided to one end of the first pipe in the extension direction thereof and to one end of the second pipe in the extension direction thereof and discharged to the return-side conduit from the other end of the first pipe in the extension direction thereof and the other end of the second pipe in the extension direction thereof.

6. The electrolytic regeneration device according to claim 1, wherein
the tubular portion has openings at both ends in the extension direction thereof; and
the regeneration unit further includes:
a seal member that is provided close to each of the openings, formed in a tubular shape having a through hole into which the cathode is inserted, interposed between the inner circumferential surface of the tubular portion and the cathode, and formed from an insulating material.

7. The electrolytic regeneration device according to claim 1, further comprising a temperature adjusting unit for adjusting a temperature of the tubular portion.

8. The electrolytic regeneration device according to claim 1, further comprising a gas discharge valve for discharging gas generated in the regeneration unit.

9. An electrolytic regeneration device for electrolyzing and regenerating a treatment liquid used in a desmearing treatment in a desmearing treatment tank, comprising:
a regeneration unit including a tubular portion having an inner circumferential surface functioning as a fixed anode and a fixed cathode provided inside the tubular portion and extending along an extension direction of the tubular portion in a state of separation from the inner circumferential surface, the treatment liquid being fed through a gap between the inner circumferential surface of the tubular portion and the cathode;
a feed-side conduit connected by a downstream end portion thereof to the tubular portion and guiding the treatment liquid discharged from the desmearing treatment tank into the regeneration unit; and
a return-side conduit connected by an upstream end portion thereof to the tubular portion and guiding the treatment liquid discharged from the regeneration unit into the desmearing treatment tank,
wherein
the regeneration unit further includes a fixed auxiliary anode disposed inside the tubular portion and directly electrically connected to the tubular portion;
the auxiliary anode is disposed opposite the cathode in a state of separation from the cathode;
the auxiliary anode has a hollow cylindrical shape extending along the cathode so as to surround a circumference of the cathode, and has a plurality of through holes; and
the treatment liquid flows to the outer side of the auxiliary anode via through holes.

* * * * *